US009266367B2

(12) United States Patent
Nagashima et al.

(10) Patent No.: US 9,266,367 B2
(45) Date of Patent: Feb. 23, 2016

(54) PRINTER

(71) Applicants: Yuki Nagashima, Nagoya (JP); Keiji Seo, Nagoya (JP); Takamine Hokazono, Nagoya (JP); Kumiko Uchino, Nagoya (JP); Hidenori Jo, Nagoya (JP)

(72) Inventors: Yuki Nagashima, Nagoya (JP); Keiji Seo, Nagoya (JP); Takamine Hokazono, Nagoya (JP); Kumiko Uchino, Nagoya (JP); Hidenori Jo, Nagoya (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 23 days.

(21) Appl. No.: 14/038,901

(22) Filed: Sep. 27, 2013

(65) Prior Publication Data

US 2014/0146493 A1 May 29, 2014

(30) Foreign Application Priority Data

Nov. 29, 2012 (JP) ................................ 2012-260881

(51) Int. Cl.

*H05K 7/02* (2006.01)
*B41J 29/393* (2006.01)
*B41J 29/02* (2006.01)
*B41J 29/13* (2006.01)
*B41J 29/38* (2006.01)

(52) U.S. Cl.

CPC ................ *B41J 29/393* (2013.01); *B41J 29/02* (2013.01); *B41J 29/13* (2013.01); *B41J 29/38* (2013.01)

(58) Field of Classification Search

CPC ........ B41J 11/0015; B41J 2/01; B41J 2/2114; B41M 5/52; B41M 7/00
USPC ......................................... 347/101, 108, 109
See application file for complete search history.

(56) References Cited

U.S. PATENT DOCUMENTS

| | | | | |
|---|---|---|---|---|
| 4,092,527 | A * | 5/1978 | Luecke | 708/140 |
| 4,439,757 | A * | 3/1984 | Gross et al. | 341/23 |
| 4,456,315 | A * | 6/1984 | Markley et al. | 312/137 |
| 5,237,487 | A * | 8/1993 | Dittmer et al. | 361/679.09 |
| 5,995,363 | A * | 11/1999 | Wu | 361/679.02 |
| 6,241,407 | B1 * | 6/2001 | Huggins et al. | 400/611 |
| 7,403,191 | B2 * | 7/2008 | Sinclair | 345/173 |
| 7,580,249 | B2 * | 8/2009 | Tsuji | 361/679.21 |
| 8,547,346 | B2 * | 10/2013 | Yoshida | 345/173 |
| 8,920,056 | B2 * | 12/2014 | Matsumura | 400/693 |

FOREIGN PATENT DOCUMENTS

| | | |
|---|---|---|
| JP | 02226323 | 9/1990 |

* cited by examiner

*Primary Examiner* — Manish S Shah
*Assistant Examiner* — Roger W Pisha, II
(74) *Attorney, Agent, or Firm* — McCarter & English, LLP

(57) ABSTRACT

This disclosure discloses a printer comprising a feeder, a printing head, a substantially cuboid-like shaped housing, a touch panel, and a cover. The printing head performs desired printing on a print-receiving medium fed by the feeder. The touch panel is capable of executing desired operation input. The cover is provided to the housing or the touch panel. The cover comprises a plurality of locking hooks. The plurality of locking hooks is provided to areas other than a center part of the cover along a longitudinal direction. The housing or the touch panel comprises a plurality of locked parts to which the plurality of locking hooks is respectively to be locked.

10 Claims, 33 Drawing Sheets

COMPARISON EXAMPLE

EMBODIMENT

PRINTER

CROSS-REFERENCE TO RELATED APPLICATION

The present application claims priority from Japanese Patent Application No. 2012-260881, which was filed on Nov. 29, 2011, the disclosure of which is incorporated herein by reference in its entirety.

BACKGROUND

1. Field

The present disclosure relates to a printer that performs printing on a print-receiving medium.

2. Description of the Related Art

There are already known configurations of electronic devices that use a touch panel as operation device. In this prior art, an operator can perform desired operation input by touching a touch panel using a fingertip, etc., from above. At this time, a cover (holding plate) is disposed so as to overlap the touch panel in an up-down direction.

On the other hand, there are known printers that form desired print on a print-receiving medium. Normally, the printer is provided with feeder configured to feed the print-receiving medium and printing head configured to perform desired printing on the print-receiving medium thus fed, in the interior of a housing with a substantially cuboid-like shape, for example. Further, operation device for performing operations related to the print contents by the printing head and other action is provided to the housing.

Hence, the touch panel of the prior art described above can be conceivably applied to the printer to provide a touch panel to the upper part of housing with a substantially cuboid-like shape. In this case, the cover is provided to the housing (or the touch panel) so as to cover the touch panel from above.

Hence, as a form of usage of the printer, the operator may grip the overall apparatus by hand from above to carry the apparatus, for example. In a case where the cover is provided to the upper part of the housing as described above, a way to ensure that the cover does not mistakenly come off when the printer is carried by the operator, even if it is assumed that the operator grips the cover, needs to be devised.

SUMMARY

It is therefore an object of the present disclosure to provide a printer capable of preventing the cover from mistakenly coming off the housing (or the touch panel) when the printer is carried while making the cover removable from the housing (or the touch panel).

In order to achieve the above-described object, according to the aspect of the present application, there is provided a printer comprising a feeder configured to feed a print-receiving medium, a printing head configured to perform desired printing on the print-receiving medium fed by the feeder, a substantially cuboid-like shaped housing comprising a longitudinal direction and a width direction, containing the feeder and the printing head, a touch panel provided to an upper part of the housing, and a cover configured to cover a portion of the touch panel, the cover comprising a plurality of locking hooks provided to areas other than a center part of the cover along the longitudinal direction, the housing or the touch panel comprising a plurality of locked parts to which the plurality of locking hooks are respectively to be locked.

In the present disclosure, a touch panel is provided to the upper part of the housing that contains feeder and printing head. An operator can perform desired operation input by touching the touch panel using a fingertip, etc., from above. At this time, according to the present disclosure, a cover is mounted on the touch panel.

The cover comprises at least partially covers the touch panel. At this time, the cover is provided to the housing (or to the touch panel). That is, a plurality of locked parts is provided to the housing (or to the touch panel) and a plurality of locking hooks capable of locking to the plurality of locked parts is provided to the cover. With this arrangement, the cover can be removed from the housing (or the touch panel) as necessary.

Hence, the housing of the present disclosure is configured in a substantially cuboid-like shape comprising a longitudinal direction and a width direction. Accordingly, the operator may grip the overall apparatus by hand from above to carry the apparatus, for example. According to the present disclosure, the cover is provided to the touch panel at the upper part of the housing, as previously described. Nevertheless, assuming that the operator grips the cover when carrying the printer as described above, it is necessary to ensure that the cover does not come off.

Hence, according to the present disclosure, the locking hooks are provided to areas other than a center part in the longitudinal direction where the operator is naturally most likely to grip the printer during the carrying, of the cover, avoiding the center part. With this arrangement, it is possible to prevent the cover from mistakenly coming off the housing (or the touch panel) during the carrying by the operator while making the cover removable from the housing (or the touch panel).

DETAILED DESCRIPTION OF THE PREFERRED EMBODIMENTS

The following describes one embodiment of the present disclosure with reference to accompanying drawings.

General Outer Appearance Configuration

First, the general outer appearance configuration of a label producing apparatus 1 (printer) of this embodiment will be described using FIG. 1. Note that the front-rear direction, left-right direction, and up-down direction in the descriptions below refer to the directions of the arrows suitably shown in each figure, such as FIG. 1.

Figure 1:
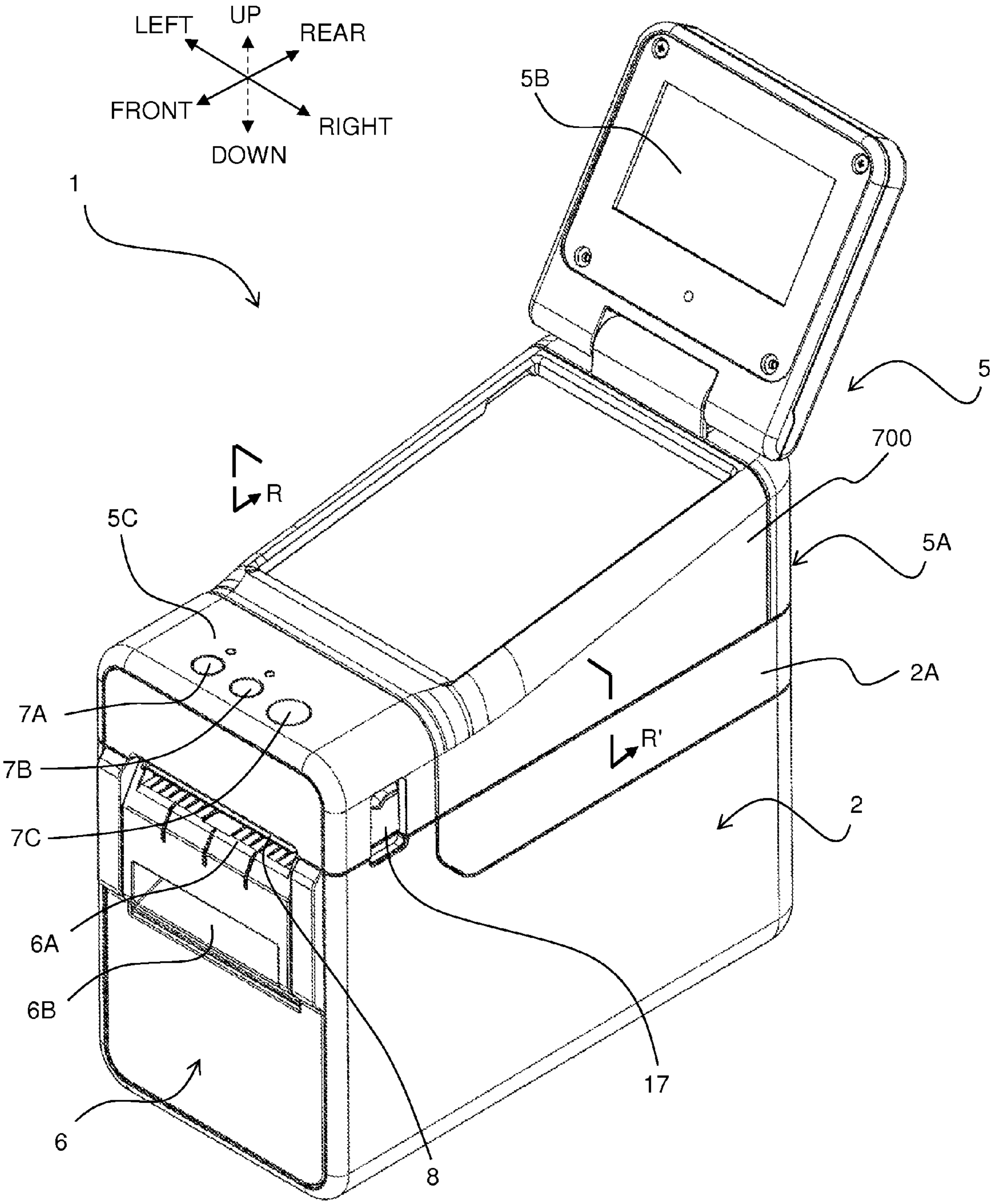
FIG. 1 is a perspective view showing the outer appearance of the label producing apparatus of one embodiment of the present disclosure.

In FIG. 1, the label producing apparatus 1 comprises a housing 2 comprising a front panel 6, and an upper cover unit 5. The housing 2 and the upper cover unit 5 are made of resin, for example. The upper cover unit 5 comprises a touch panel 5A, a substantially rectangular-shaped liquid crystal panel part 5B configured to execute desired displays, and an operation button part 5C.

The upper cover unit 5 is pivotably connected to the housing 2 at the rearward end part via a pivot shaft part 2*a* (refer to FIG. 4 described later), forming a structure capable of opening and closing with respect to the housing 2. Note that the housing cover part 2A constituting a part of the above described housing 2 is integrally configured with the lower part of the upper cover unit 5, causing the housing cover part 2A to also open and close in an integrated manner with the opening and closing of the upper cover unit 5 (refer to FIG. 2, FIG. 3, etc. described later).

The liquid crystal panel part 5B pivots via a pivot shaft part 5*a* (refer to FIG. 4 described later) and is thus elevatably connected to the touch panel 5A at the rearward end part, forming a structure capable of opening and closing with respect to the touch panel 5A.

The operation button part 5C is provided to an upper surface position near the front of the upper cover unit 5, and disposes a power supply button 7A of the label producing apparatus 1, a status button 7B for displaying the peripheral device operation status, a feed button 7C, and the like.

Both left and right side walls of the housing 2 are provided with a release tab 17. Pressing this release tab 17 upward releases the locking of the upper cover unit 5 to the housing 2, making it possible to open the upper cover unit 5.

A first discharging exit 6A and a second discharging exit 6B positioned in an area below the first discharging exit 6A are provided to the front panel 6. Further, the section of the front panel 6 that comprises the second discharging exit 6B forms an opening/closing lid 6 pivotable toward the frontward side to improve the convenience of the installation of a print-receiving tape 3A described later, paper ejection, and the like, for example.

The first discharging exit 6A is formed by a front surface upper edge part of the housing 2 and a front surface lower edge part of the above described upper cover unit 5 when the upper cover unit 5 is closed. Note that a cutting blade 8 is provided to the lower edge inner side of the first discharging exit 6A side of the upper cover unit 5 (refer to FIG. 2, FIG. 3, and the like as well, described later), facing downward.

Inner Structure

Next, the inner structure of the label producing apparatus 1 of this embodiment will be described using FIG. 2, FIG. 3, and FIG. 4.

Figure 2:
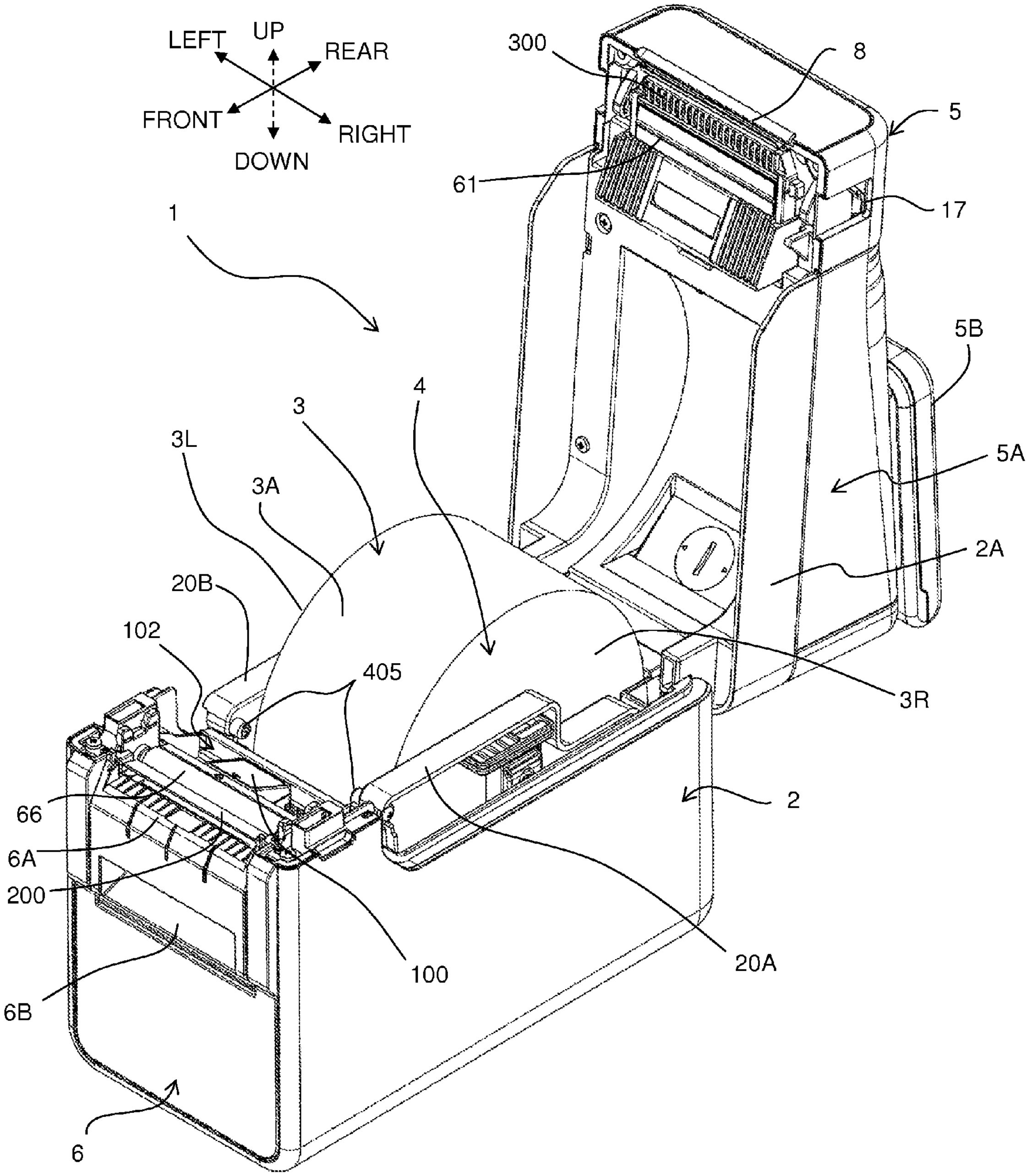
FIG. 2 is a perspective view showing the label producing apparatus with the upper cover unit open and the roll mounted.
Figure 3:
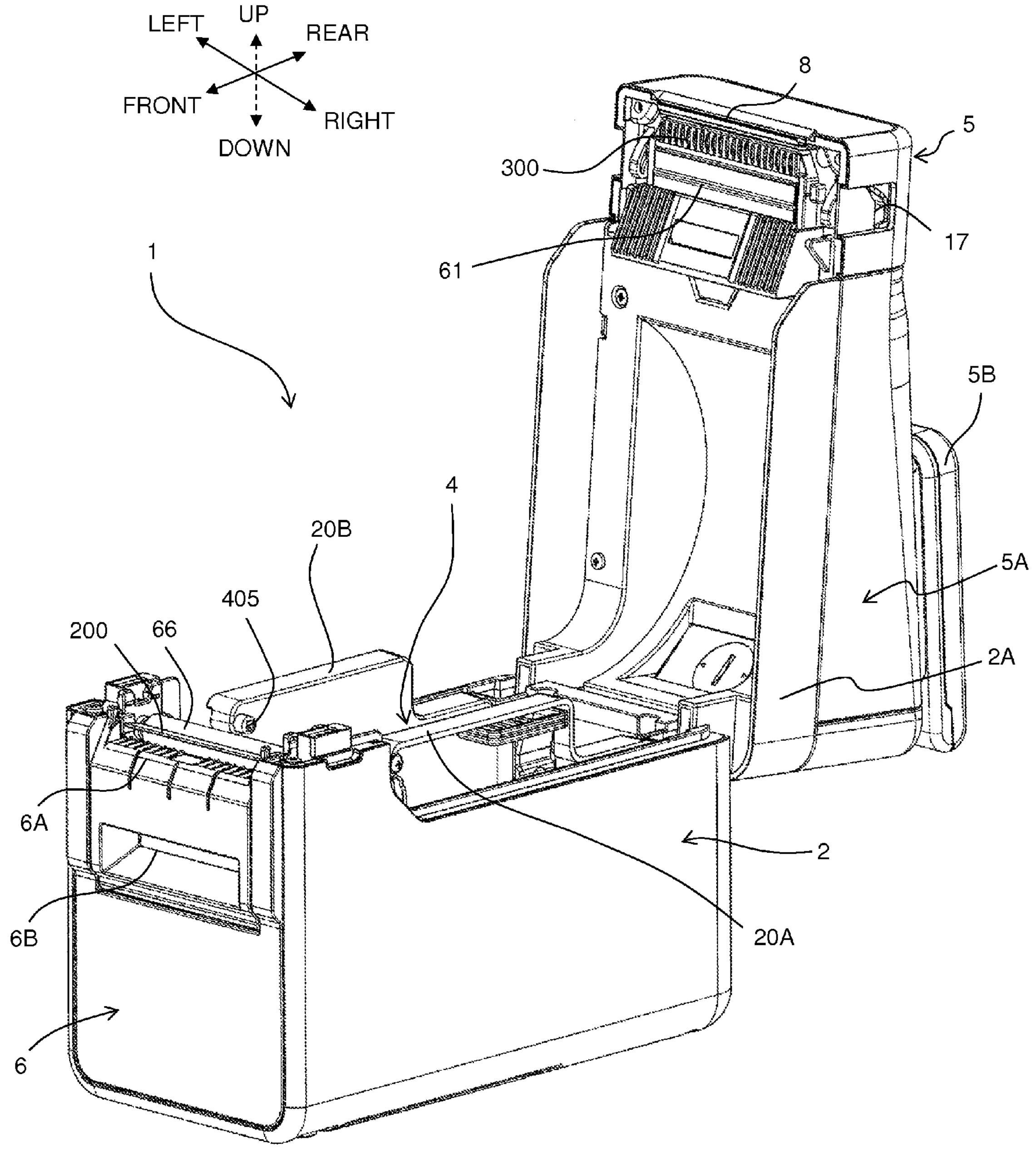
FIG. 3 is a perspective view showing the label producing apparatus with the upper cover unit open and the roll removed.

As shown in FIG. 2 and FIG. 3, the label producing apparatus 1 comprises a recessed roll storage part 4 rearward from the interior space of the housing 2. The roll storage part 4 stores a roll 3 around which a print-receiving tape 3A with a desired width is wound into a roll shape so that the print-receiving tape 3A is fed out from the roll upper side.

The roll 3 is rotatably stored in the roll storage part 4 with the axis line of the winding of the above described print-receiving tape 3A in the left-right direction orthogonal to the front-rear direction.

Print-Receiving Tape

Figure 4:
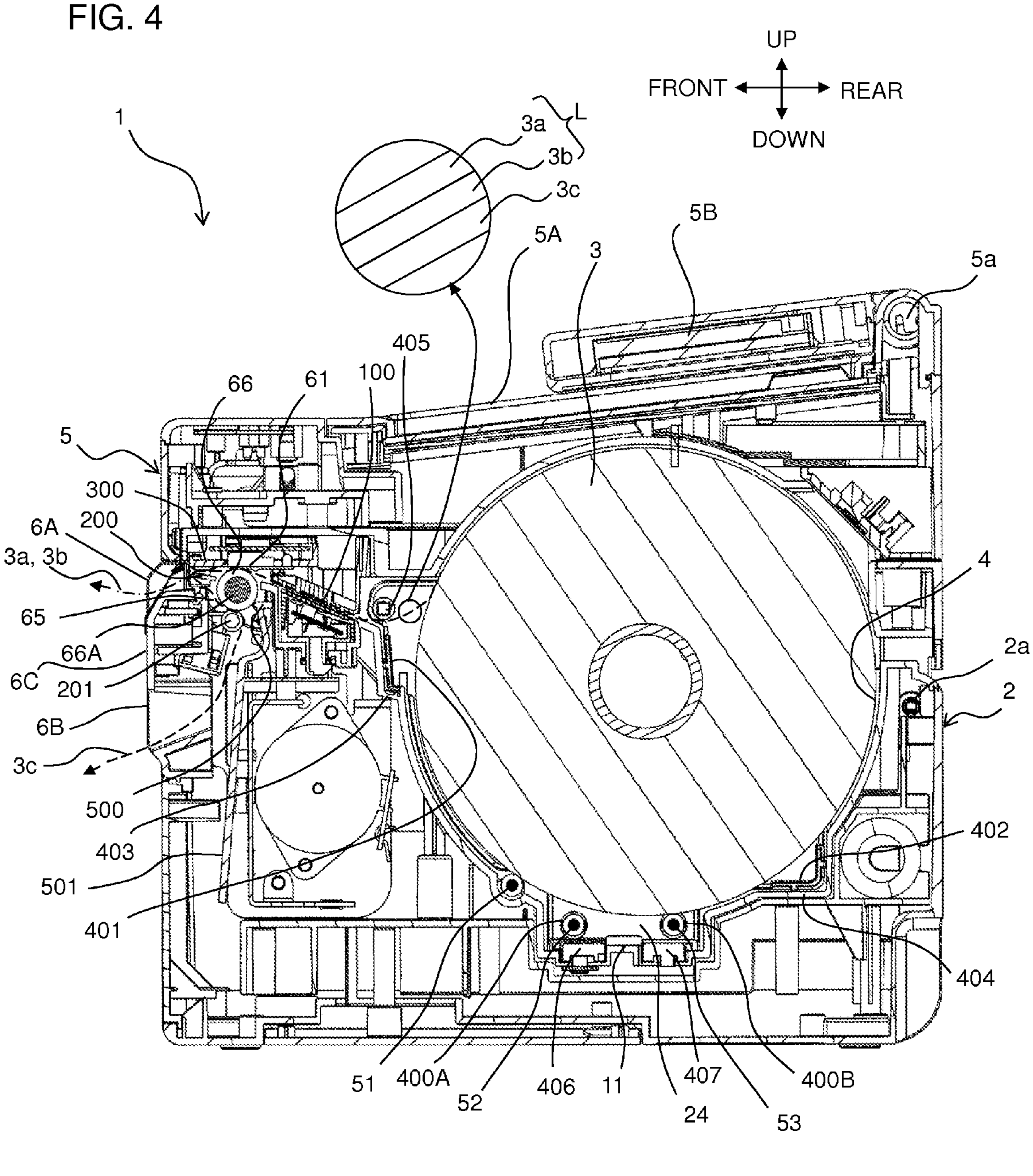
FIG. 4 is a side sectional view showing the overall structure of the label producing apparatus.

A label mount L used for a price tag, for example, is consecutively disposed along a longitudinal direction on a separation material layer 3*c* of the print-receiving tape 3A constituting the roll 3, as shown in the enlarged view in FIG. 4. That is, the label mount L forms a two-layer structure in this example, layered in the order of a print-receiving layer 3*a* on which print is formed by a print head 61, and an adhesive layer 3*b*. Then, the label mount L is adhered to the surface on one side of the separation material layer 3*c* at a predetermined interval, by the adhesive force of the above described adhesive layer 3*b*. That is, the print-receiving tape 3A is a three-layer structure comprising the print-receiving layer 3*a*, the adhesive layer 3*b*, and the separation material layer 3*c* in a section where the label mount L is adhered (refer to the enlarged view in FIG. 4), and a one-layer structure of only the separation material layer 3*c* in a section where the label mount L is not adhered (that is, in a section between two of the label mounts L). The label mount L on which printing was completed is in the end peeled from the separation material layer 3*c*, making it possible to affix the label mount L to an adherent such as a predetermined good or the like as a print label.

Support Rollers

Three support rollers 51-53 are provided to the bottom surface part of the roll storage part 4. The support rollers 51-53 are driven to rotate and rotatably support the roll 3 by the contact of at least two with the outer peripheral surface of the roll 3 when a platen roller 66 is rotationally driven, pulling out the print-receiving tape 3A from the roll 3. These three support rollers vary in position in the circumferential direction with respect to the roll 3, and are disposed in the order of the first support roller 51, the second support roller 52, and the third support roller 53, along the circumferential direction of the roll 3, from the front to the rear. The first to third support rollers 51-53 are separated into a plurality of sections in the above described left-right direction (in other words, the roll width direction), and only the sections on which the roll 3 is mounted rotate in accordance with the roll width.

Guide Member

On the other hand, a first guide member 20A that contacts an end surface 3R on the right side of the roll 3 and guides the print-receiving tape 3A in the left-right direction (that is, the tape width direction; hereinafter the same), and a second guide member 20B that contacts an end surface 3L on the left side of the roll 3 and guides the print-receiving tape 3A in the left-right direction are provided to the roll storage part 4. The first guide member 20A and the second guide member 20B are capable of moving close to and away from each other by advancing and retreating along the above described left-right direction. Then, the first guide member 20A contacts the roll 3 from the right side and the second guide member 20B contacts the roll 3 from the left side, thereby guiding the print-receiving tape 3A while the roll 3 is sandwiched from both sides. Since both of the guide members 20A and 20B are thus provided in an advanceable and retreatable manner along the left-right direction, both of the guide members 20A and 20B are made to advance and retreat and adjust position in accordance with the width of the stored roll 3, thereby sandwiching the roll 3 with any width by both of the guide members 20A and 20B and guiding the width direction of the print-receiving tape 3A. Note that the details of the support structure for making the guide members 20A and 20B advance and retreat will be described later.

Sensor Unit

Further, on the frontward side of the roll storage part 4, a sensor disposing part 102 (refer to FIG. 14, etc., described later), which is a recessed mounting surface, is provided to the feeding path of the print-receiving tape 3A. A sensor unit 100 for optically detecting a predetermined reference position of the above described print-receiving tape 3A is provided to this sensor disposing part 102, in a movable manner along the width direction (that is, the above described left-right direction) of the roll 3 (print-receiving tape 3A). Note that the detailed structure of this sensor unit 100 will be described later.

Platen Roller, Print Head, and Peripheral Structure Thereof.

On the other hand, the print head 61 is provided to the front end lower side of the upper cover unit 5, as shown in FIG. 4. Further, the platen roller 66 is provided to the front end upper side of the housing 2, facing the print head 61 in the up-down direction. A roller shaft 66A of the platen roller 66 is rotatably supported by a bracket 65 (refer to FIG. 4) provided to both axial ends, and a gear (not shown) that drives the platen roller 66 is fixed to one shaft end of the roller shaft 66A.

At this time, the disposed position of the platen roller 66 in the housing 2 corresponds to the installation position of the print heat 61 in the upper cover unit 5. Then, with the closing of the upper cover unit 5, the print-receiving tape 3A is sandwiched by the print head 61 provided to the upper cover unit 5 side and the platen roller 66 provided to the housing 2 side, making it possible to perform printing by the print head 61. Further, with the closing of the upper cover unit 5, the above described gear fixed to the roller shaft 66A of the platen roller 66 meshes with a gear train (not shown) on the housing 2 side, and the platen roller 66 is rotationally driven by a platen roller motor 211 (refer to FIG. 28 described later) comprising a stepping motor, etc. With this arrangement, the platen roller 66 feeds out the print-receiving tape 3A from the roll 3 stored in the roll storage part 4, and the print-receiving tape 3A is fed in a posture in which the tape width direction thereof is in the left-right direction.

The print head 61 is fixed to one end of a support member 62 (refer to FIG. 5 described later) that supports the middle part thereof and is energized downward by a suitable spring member (not shown). The upper cover unit 5 is changed to an open state by the release tab 17, causing the print head 61 to separate from the platen roller 66 (refer to FIG. 3, etc.). On the other hand, with the closing of the upper cover unit 5, the print head 61 presses and energizes the print-receiving tape 3A toward the platen roller 66 by the energizing force of the spring member, making printing possible.

Note that the above described roll 3 is configured by winding the print-receiving tape 3A into a roll shape so that the above described label mounts L are positioned on the outside in the diameter direction. As a result, the print-receiving tape 3A is fed out from the upper side of the roll 3 with the surface of the label mount L side facing upward (refer to the wavy line in FIG. 4), and print is formed by the print head 61 disposed on the upper side of the print-receiving tape 3A.

Further, a separation plate 200 for looping back the separation material layer 3*c* toward the downward side of the platen roller 66 and thus peeling the above described print-receiving layer 3*a* and adhesive layer 3*b* from the separation material layer 3*c* is provided further on the frontward side than the platen roller 66. The print-receiving layer 3*a* with print and the adhesive layer 3*b* peeled from the separation material layer 3*c* by the above described separation plate 200 are discharged to outside the housing 2 via the above described first discharging exit 6A positioned further on the frontward side than the separation plate 200. The cutting blade 8 is used to cut the print-receiving layer 3*a* and adhesive layer 3*b* discharged to the outside of the housing 2 via the above described first discharging exit 6A at a position preferred by the operator.

On the other hand, a pinch roller 201 that feeds the separation material layer 3*c* looped back toward the downward side by the above described separation plate 200, sandwiching the separation material layer 3*c* with the platen roller 66, is provided below the platen roller 66. The above described separation material layer 3*c* fed by the above described pinch roller 201 is discharged from the above described second discharging exit 6B to the outside of the housing 2. Note that this pinch roller 201 is provided to an opening/closing lid 6C via a suitable support member (not shown).

Overview of Feeding of Print-Receiving Tape

In the above described configuration, when the upper cover unit 5 is closed and the platen roller 66 is rotationally driven by the above described platen roller motor 211, the print-receiving tape 3A is pulled. With this arrangement, the print-receiving tape 3A is fed out from the roll 3 while guided in the width direction by the guide member 20A and the guide member 20B. The print-receiving tape 3A fed out from the roll 3 is subjected to printing by the print head 61, and looped back toward the downward side of the platen roller 66 by the separation plate 200. At this time, taking advantage of the fact that the firm print-receiving layer 3*a* cannot be driven on such a looped back path, the print-receiving layer 3*a* and the adhesive layer 3*b* are peeled from the separation material layer 3*c* as previously described. The print-receiving layer 3*a* and the adhesive layer 3*b* (in other words, the label mount L) thus peeled by the separation plate 200 are discharged to the outside of the housing 2 from the first discharging exit 6A and used as a print label. Note that FIG. 4 indicates the feeding path of the print-receiving tape 3A fed out and fed from the roll 3 by a wavy or dashed line.

Pressing Structure of Print-Receiving Tape

Next, the pressing structure with respect to the print-receiving tape 3A fed on the above described path, which is one special characteristic of this embodiment, will be described using FIG. 5, FIG. 6, and FIG. 7.

Figure 5A:
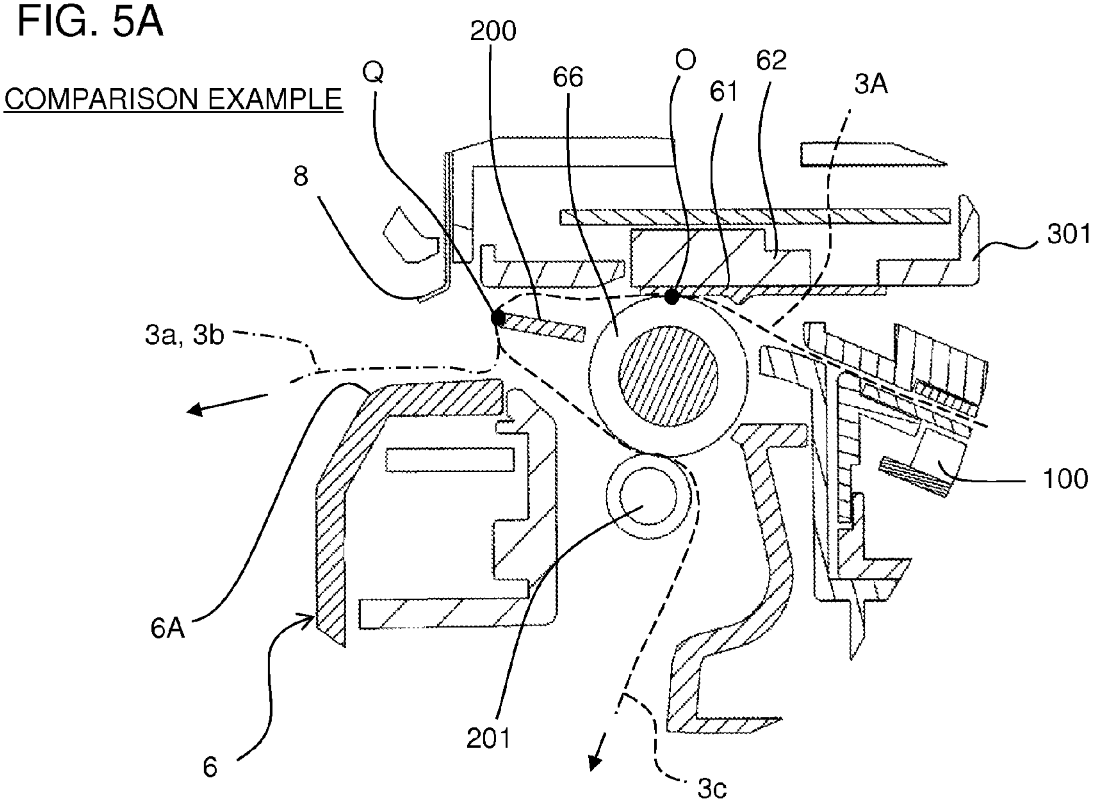
FIG. 5A is an explanatory view of the print-receiving layer and adhesive layer peeled by a separation plate in a comparison example in which a rib member is not provided.

As previously described, the separation material layer 3*c* of the print-receiving tape 3A after print formation by the print head 61 is looped back and the print-receiving layer 3*a* and the adhesive layer 3*b* are peeled by the separation plate 200. At this time, as shown in FIG. 5A, if the print-receiving tape 3A is slack from a sandwiching position O sandwiched by the print head 61 and the platen roller 66 to a support position Q by the above described separation plate 200, the above described peeling may not become adequately favorable (refer to FIG. 5A described later).

Figure 5B:
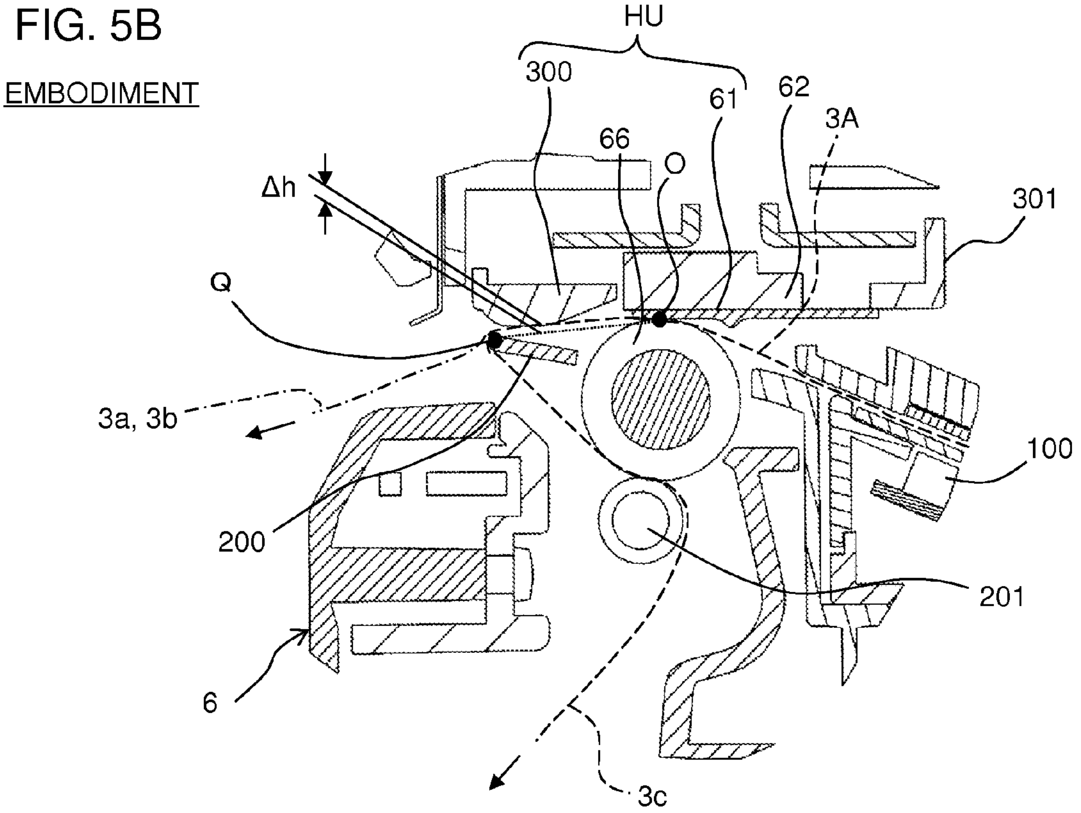
FIG. 5B is and an explanatory view of the print-receiving layer and adhesive layer peeled by a separation plate in an embodiment in which a rib member is provided.
Figure 6:
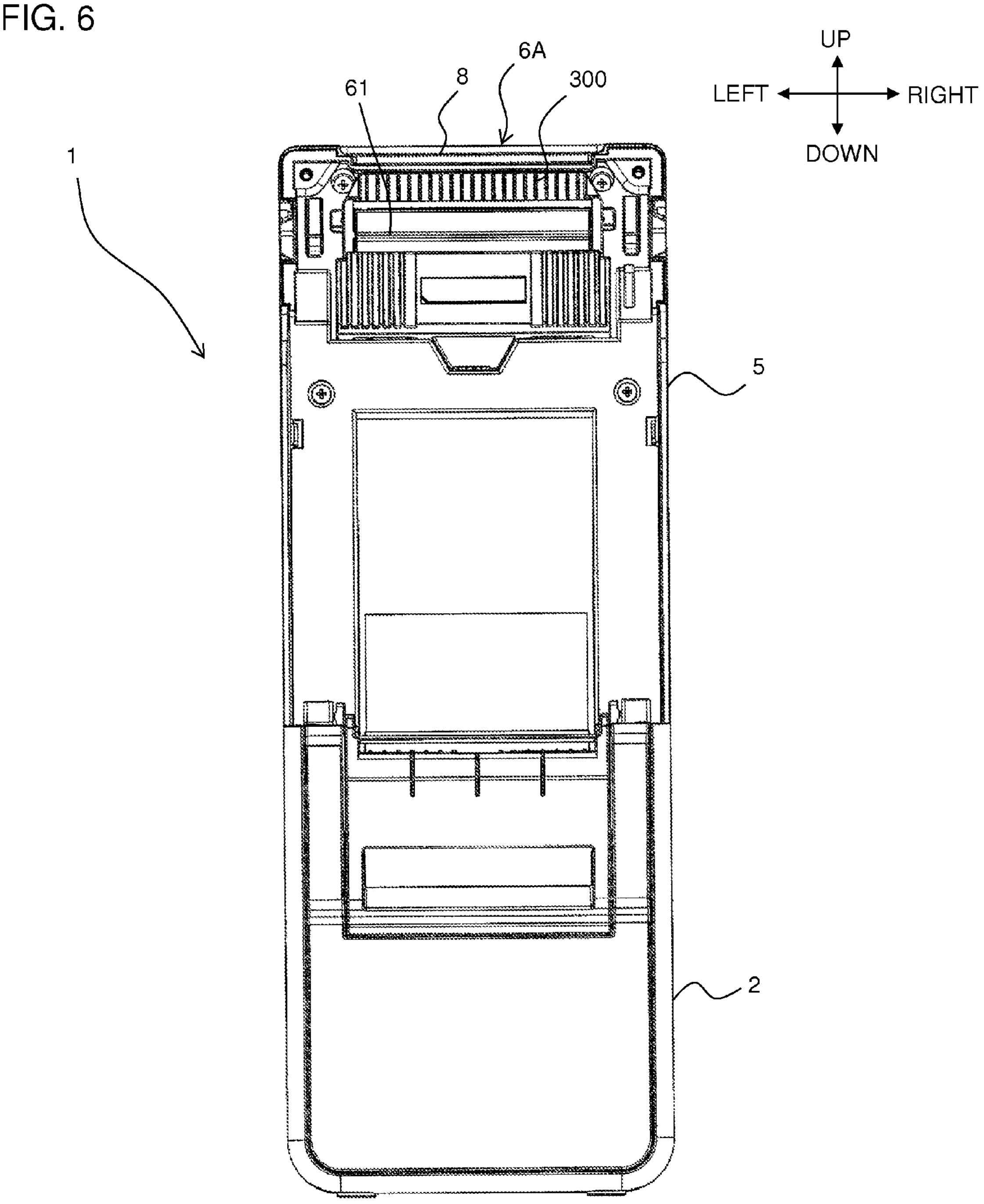
FIG. 6 is a front view showing the label producing apparatus with the upper cover unit open and the roll mounted.

Hence, according to this embodiment, as shown in FIG. 5B, FIG. 6, and the above described FIG. 4, a rib member 300 is provided above the section between the above described sandwiching position O and the above described support position Q of the feeding path of the print-receiving tape 3A. This rib member 300 contacts the print-receiving tape 3A fed through the section between the above described sandwiching position O and the support position Q from above, thereby making the feeding path of the print-receiving tape 3A substantially linear (so that it can be fed in a nearly stretched state, for example), as shown in FIG. 5B. With this arrangement, it is possible to most favorably and effectively perform the above described peeling. Note that the rib member 300 is disposed so that the lower end thereof is positioned above the line directly connecting the above described sandwiching position O and the above described support position Q by an amount equivalent to Δh, as shown in FIG. 5B. Further, the separation plate 200 is disposed so that the height-direction position of the above described support position Q is below the height-direction position of the above described sandwiching position O sandwiched by the platen roller 66 and the print head 61.

Figure 7:
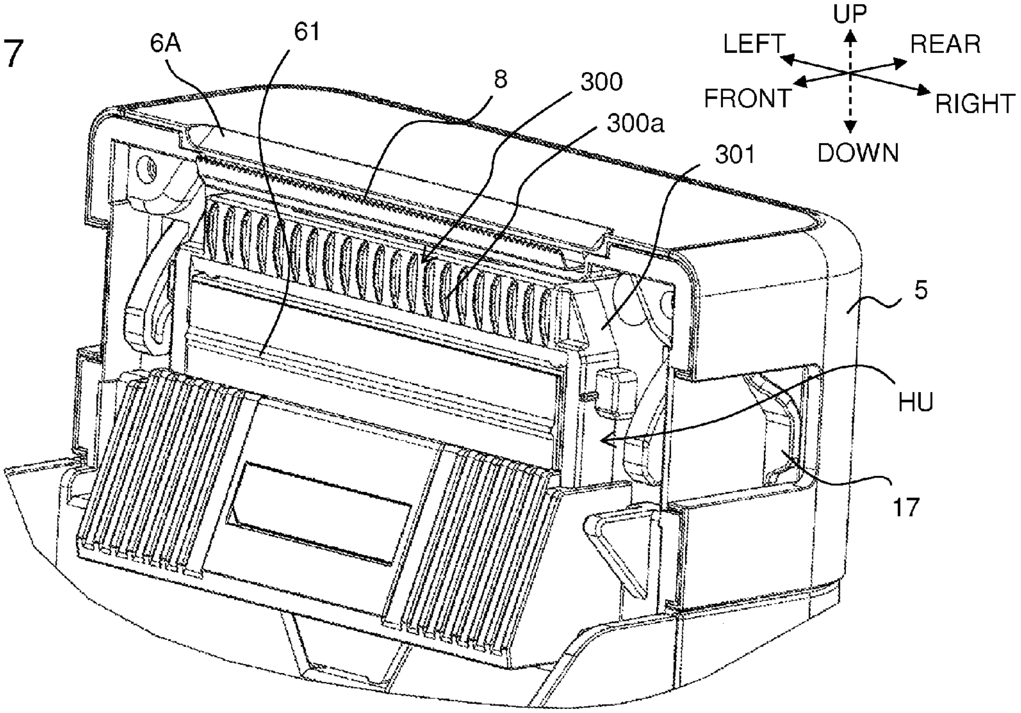
FIG. 7 is a partially enlarged perspective view of the configuration shown in FIG. 2, and a perspective view with the head unit extracted.
Figure 7:
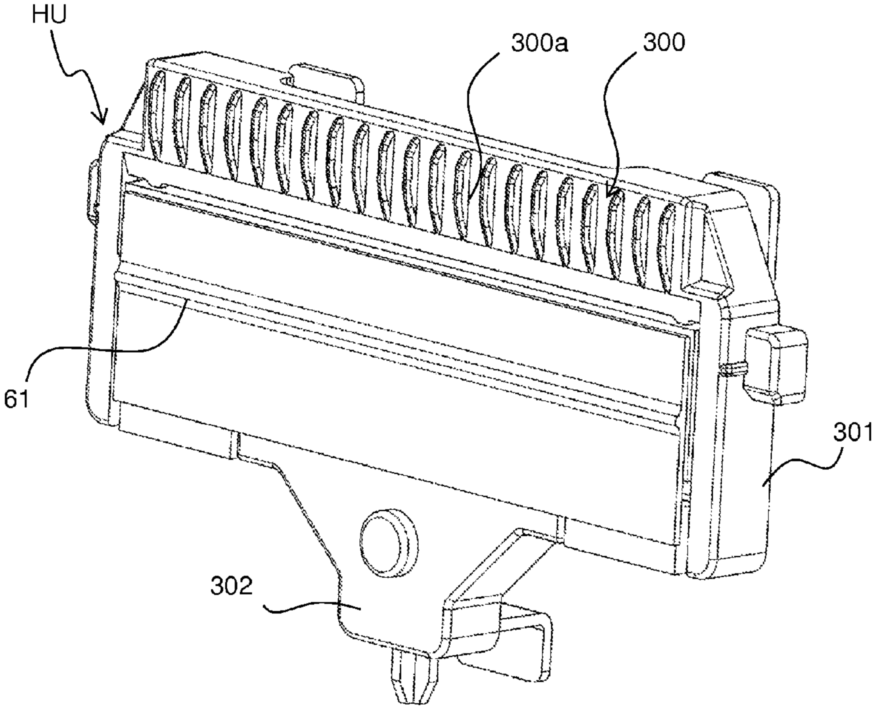

Further, the rib member 300, as shown in FIG. 7B, is disposed on an end part of a substantially rectangular tray-shaped bracket 301, and a plurality of ribs 300*a* protruding in a substantially bow-like shape is provided in a row arrangement at substantially equal intervals in the above described left-right direction. Further, an oscillation support part 302 is provided in a protruding manner to the end part of the side opposite the above described rib member 300 of the bracket 301. At this time, the above described print head 61 with a rectangular plate shape is mounted to the center opening of the above described bracket 301. With this arrangement, the rib member 300 and the print head 61 are integrally configured as a head unit HU (refer to FIG. 7). As a result, as shown in FIG. 5B, the head unit HU (including the rib member 300 and the print head 61) oscillates in its entirety via the above described oscillation support part 302, with the above described sandwiching position O serving as the fulcrum point, making it possible for the head unit HU to flexibly move close to and away from the above described feeding path.

Details of Advancing/Retreating Support Structure of Guide Member

Next, the details of the advancing/retreating support structure of both of the guide members 20A and 20B based on the above described first to third support rollers 51, 52, and 53, which is yet another special characteristic of this embodiment, will be described using FIGS. 8-13.

Rail Member and Guide Support Part

Figure 8:
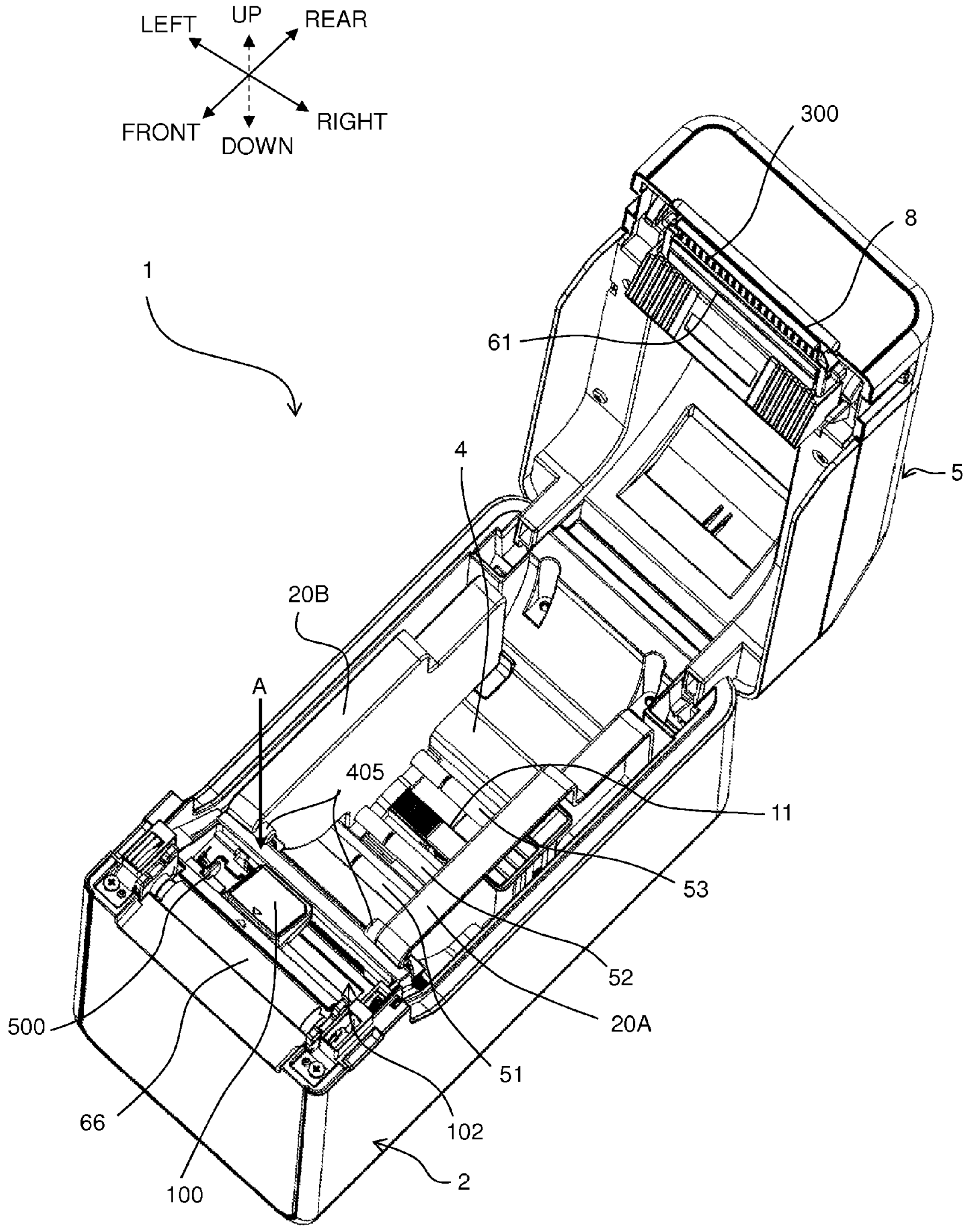
FIG. 8 is a perspective view showing the label producing apparatus with the upper cover unit open and the roll removed.
Figure 9:
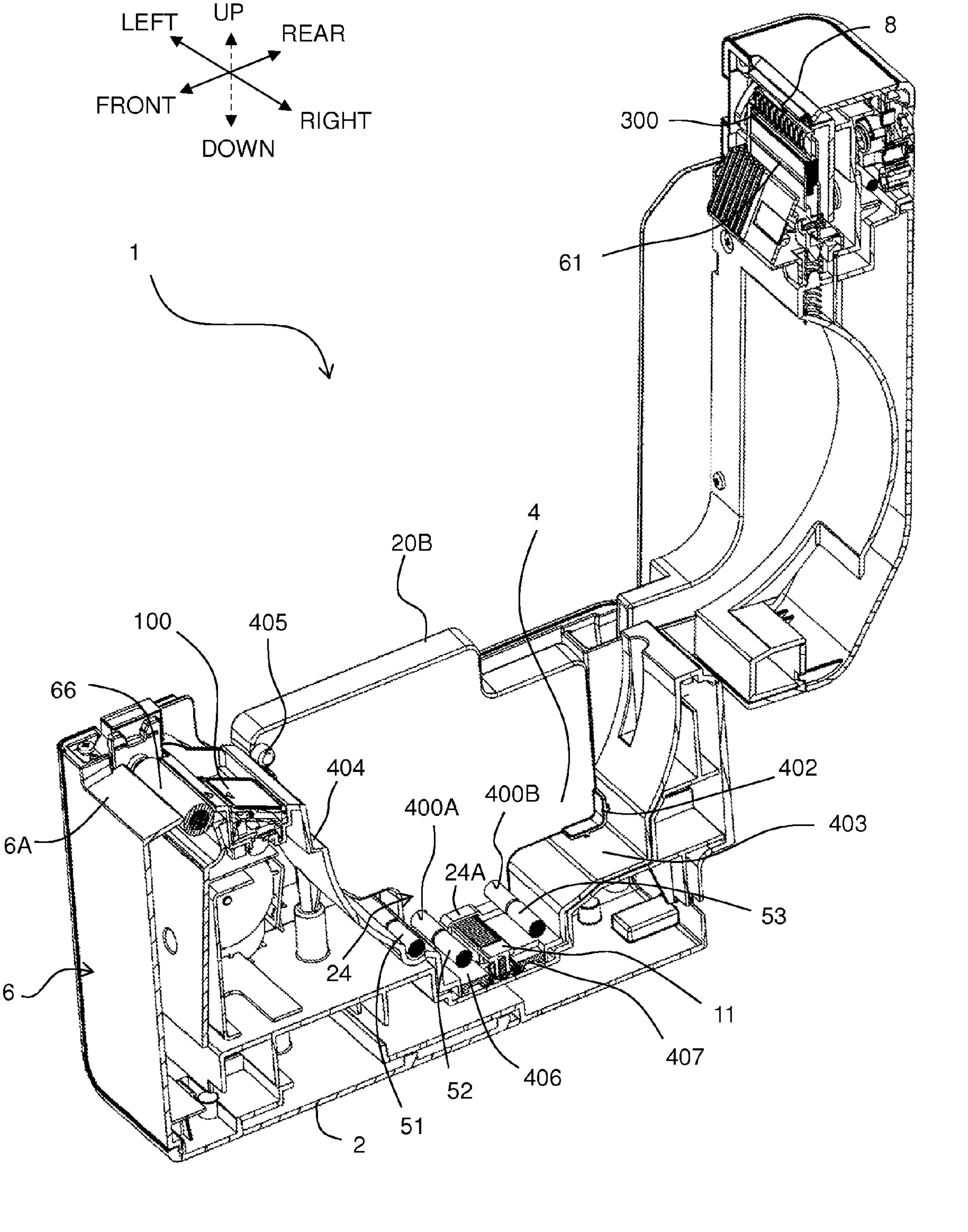
FIG. 9 is a perspective view of the configuration shown in FIG. 8 cut away on a vertical plane.
Figure 10:
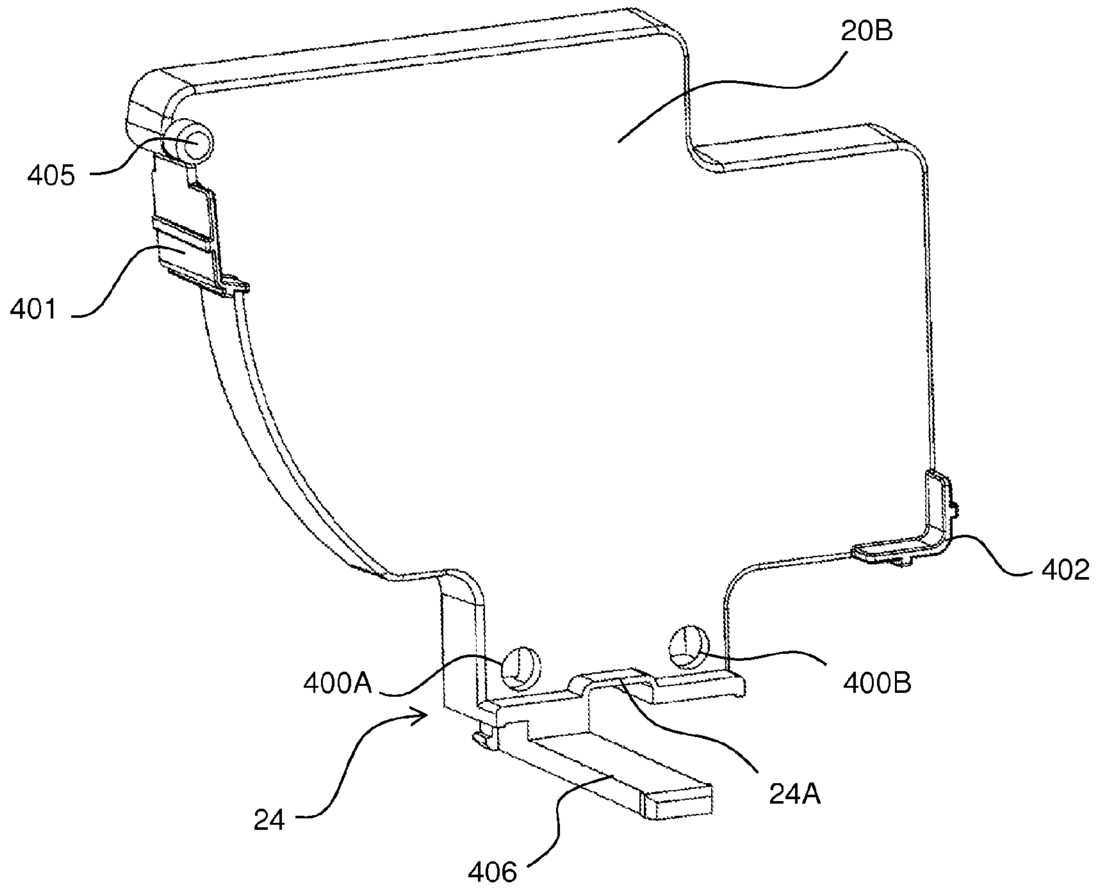
FIG. 10 is a perspective view showing the detailed structure of the guide member.
Figure 11:
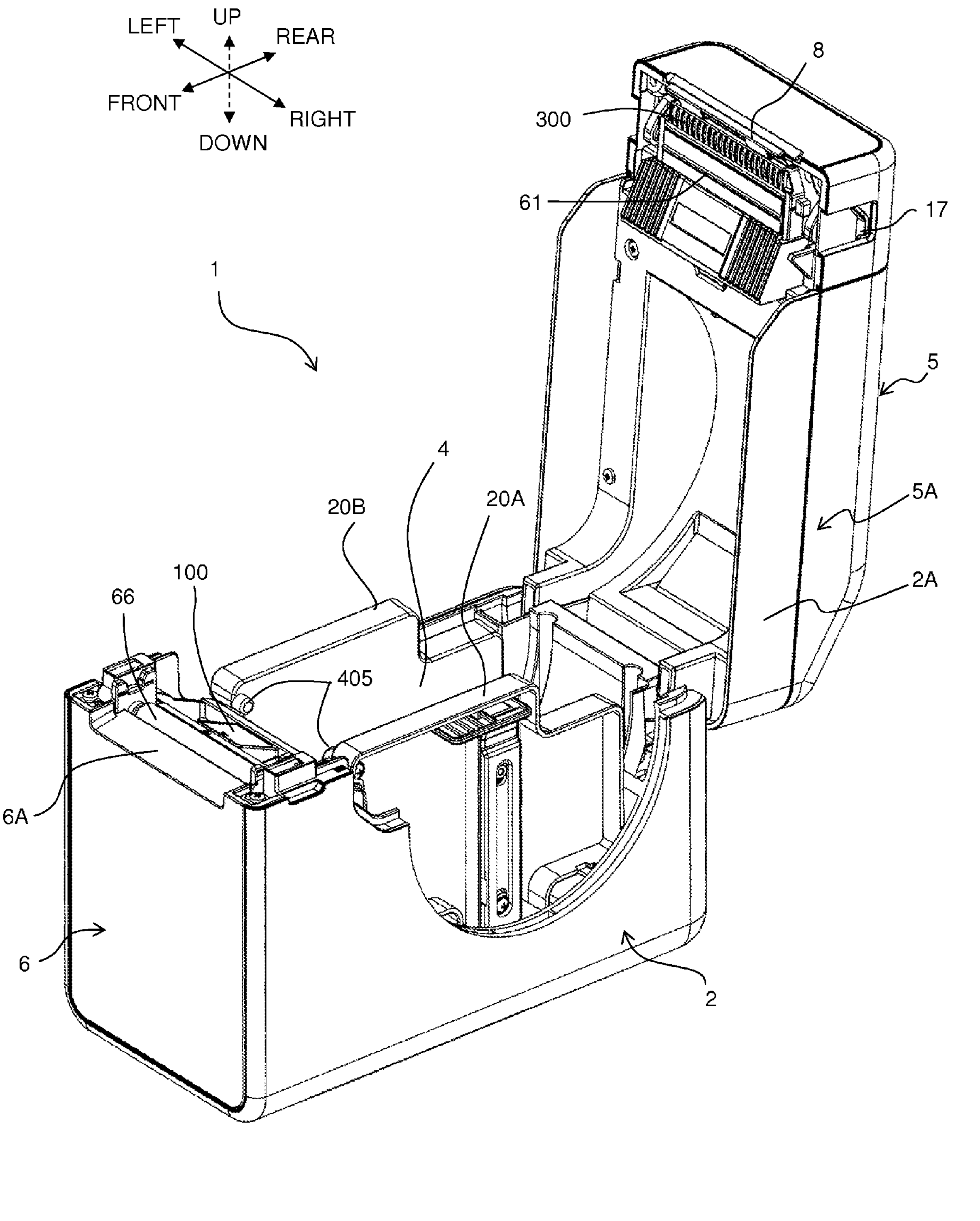
FIG. 11 is a partial cutaway perspective view of the configuration shown in FIG. 8.

As shown in FIG. 8 and FIG. 9, a rail member 11 is provided to the bottom surface of the roll storage part 4. On the other hand, as shown in FIG. 9 and FIG. 10, a guide support part 24 is correspondingly provided to the guide members 20A and 20B. The guide support part 24 comprises a recessed fitting part 24A at the lower end center thereof. Then, the above described rail member 11 fits together with the fitting part 24A of the above described guide support part 24 of the guide members 20A and 20B along the width direction (that is, the above described left-right direction) of the roll 3, permitting and guiding the advancing and retreating of the guide members 20A and 20B and holding the advancing/retreating-direction position thereof. Note that while FIG. 10 shows the detailed structure using the guide member 20B as an example, the guide member 20A has substantially the same structure (other than the left and right being in reverse) as well (refer to FIG. 11).

Figure 12:
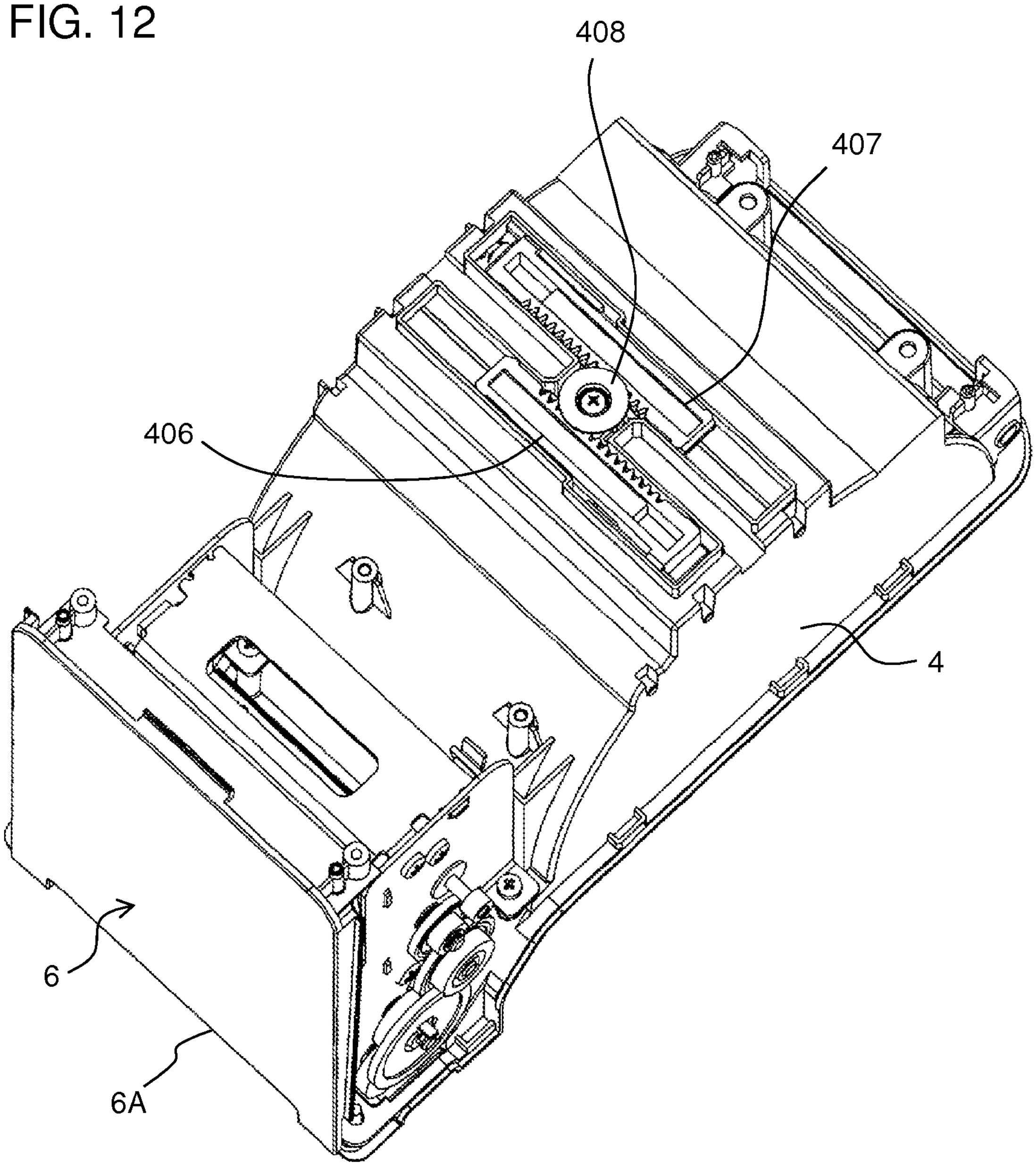
FIG. 12 is a perspective view of the roll storage part where the guide member is provided, as viewed from the lower surface side.

At this time, as shown in FIG. 12 and the above described FIG. 10, rack members 406 and 407 are provided in a protruding manner in the horizontal direction to the guide members 20A and 20B, each to one side of the fitting part 24A of the guide support part 24. These rack members 406 and 407 are provided alternately facing each other on each of the guide support parts 24 of the guide members 20A and 20B. Then, as shown in FIG. 12, both of the rack members 406 and 407 mesh from both sides with a center gear 408 on the lower surface side of the roll storage part 4. As a result, simply moving only one of the guide members 20A and 20B (the guide member 20A in this example) to one side along the rail 11 moves the other (the guide member 20B in this example) in the other direction along the rail via the gear 408 in tandem.

Through-Hole of Guide Support Part

Then, as one special characteristic of this embodiment, through-holes 400A and 400B are provided to both one side (the left side in FIG. 10) and the other side (the right side in FIG. 10) along the transport direction of the print-receiving tape 3A of the guide support part 24 of the guide members 20A and 20B. The previously described second support roller 52 and third support roller 53 provided to the bottom surface part of the above described roll storage part 4 are respectively inserted through these through-holes 400A and 400B along the above described left-right direction, guiding the advancing and retreating of the guide members 20A and 20B along the above described left-right direction.

Figure 13A:
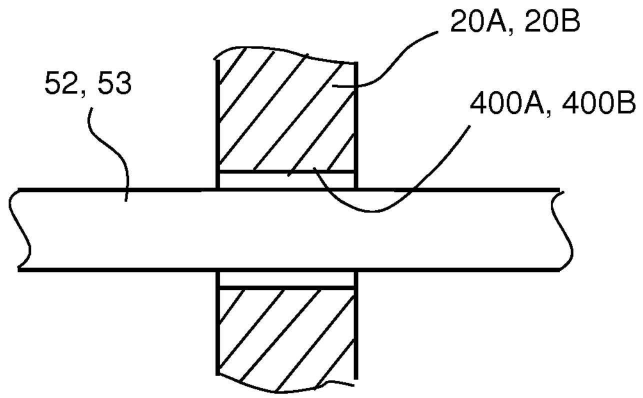
FIG. 13A is an explanatory view explaining the tilt prevention function of the guide member.
Figure 13B:
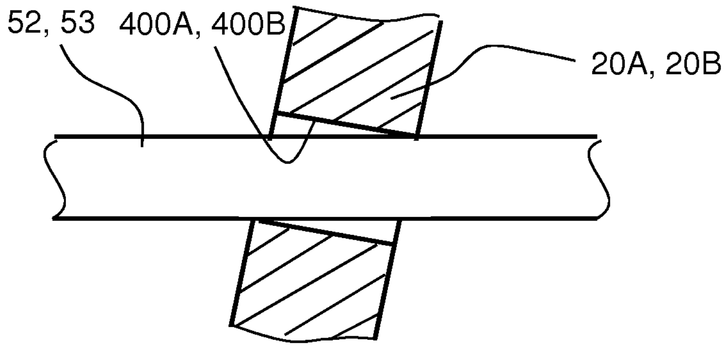
FIG. 13B is an explanatory view explaining the tilt prevention function of the guide member.

Specifically, as shown in FIG. 13A, the second support roller 52 and the third support roller 53 are inserted through the through-holes 400A and 400B formed on the above described guide support part 24 with a slight amount of clearance. With this arrangement, the guide members 20A and 20B can smoothly advance and retreat along the left-right direction such as described above. Note that, as shown in FIG. 13B, when the guide members 20A and 20B are tilted to a certain degree, the inner wall surface of the through-holes 400A and 400B contacts the outer diameter of the second support roller 52 and the third support roller 53. With this arrangement, the tilt of the guide members 20A and 20B is restricted so that it does not increase any further.

Further, engaging and sliding parts 401 and 402 with a rib-protruding shape are further respectively provided to an end part (or near the end part) of a frontward side and a rearward side of the print-receiving tape 3A on the guide members 20A and 20B (refer to FIG. 10, etc.). These engaging and sliding parts 401 and 402 respectively engage with step-shaped engaged parts 403 and 404 (refer to FIG. 9 and the previously described FIG. 4) provided to the above described roll storage part 4, and slide with the engaged parts 403 and 404 when the guide members 20A and 20B advance and retreat along the above described left-right direction, thereby guiding the advancing and retreating.

Further, a guide protruding part 405 is provided in a protruding manner along the above described left-right direction to the upper part of the frontward side of the guide members 20A and 20B. This guide protruding part 405 contacts and guides a width-direction end part of the print-receiving tape 3A fed out from the roll 3 from above. With this arrangement, it is possible to suppress the flopping of the print-receiving tape 3A in the up-down direction at both end parts of the print-receiving tape 3A fed out from the roll 3 that rotates inside the roll storage part 4.

Sensor Unit

Next, the sensor unit 100 provided to the feeding path of the print-receiving tape 3A, which is yet another special characteristic of this embodiment, will be described using FIGS. 14-17. Note that, in FIG. 14, peripheral members are suitably simplified in order to show the positional relationship of the sensor unit 100.

As shown in the aforementioned FIG. 2, FIG. 8, etc., in the label producing apparatus 1 of this embodiment, the platen roller 66 feeds out and feeds the print-receiving tape 3A from the roll 3 stored in the roll storing part 4, and desired printing is performed on the print-receiving tape 3A by the print head 61, thereby producing the print label as previously described. At this time, the above described sensor unit 100 provided to the feeding path of the print-receiving tape 3A detects a predetermined reference position of the print-receiving tape 3A and printing control is performed, such as determination of the print start position by the print head 61 using the reference position. This sensor unit 100 is held near the tape surface of the print-receiving tape 3A on the upstream side of the print head 61 in the transport direction.

Figure 14:
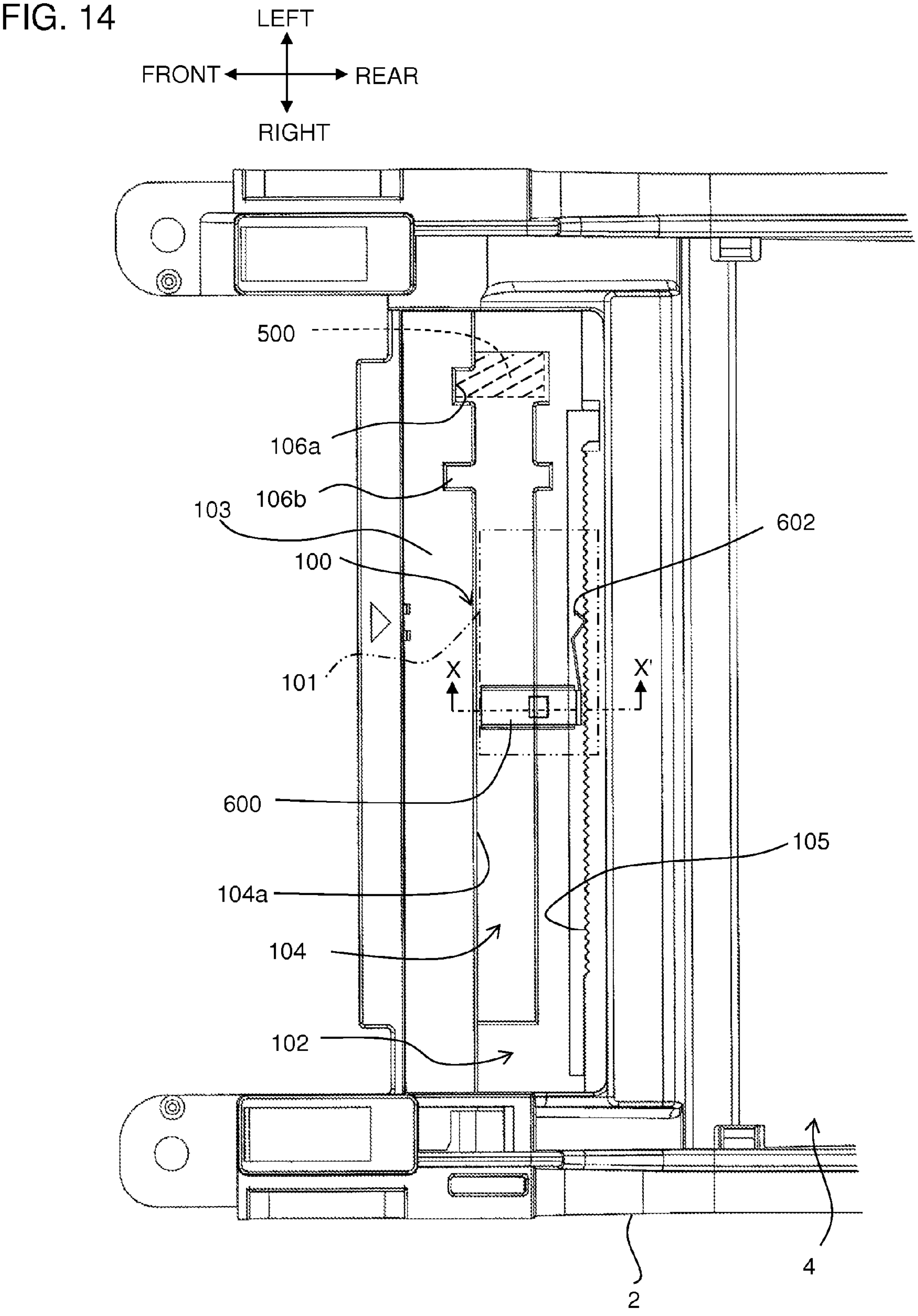
FIG. 14 is an enlarged plan view showing the details near the sensor unit, as viewed from direction A in FIG. 8.
Figure 15:
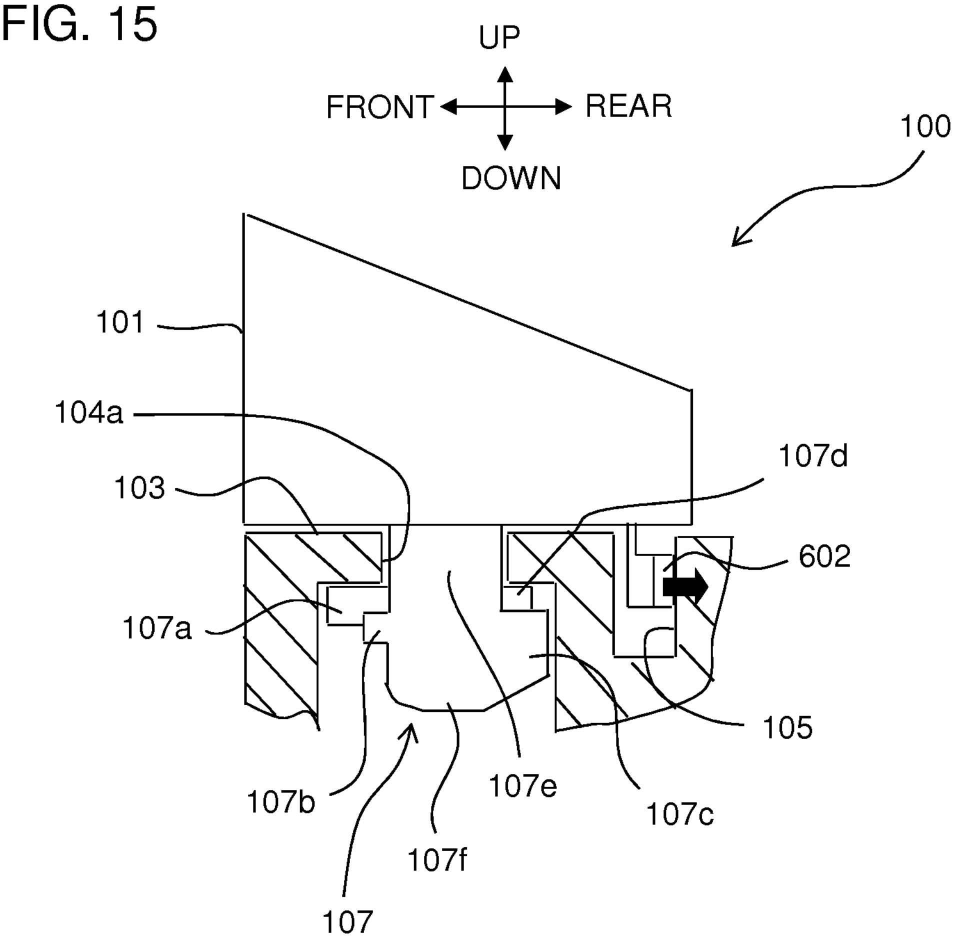
FIG. 15 is a cross-sectional view along a line X-X' in FIG. 14.

As shown in FIG. 14, FIG. 15, etc., the sensor disposing part 102 is formed as a recessed part between the platen roller 66 and the roll storage part 4 on the feeding path of the print-receiving tape 3A. In case a plurality of types of print-receiving tapes 3A comprising various widths is used, the sensor unit 100 is movably disposed along the width direction (that is, the above described left-right direction) of the print-receiving tape 3A orthogonal to the transport direction of the print-receiving tape 3A on the sensor disposing part 102.

Overview of Sensor Unit and Sensor Disposing Part

The sensor unit 100 comprises a sensor main body 101. The sensor main body 101 is a known reflective sensor comprising a light-emitting part (not shown) and a light-receiving part (not shown). That is, the light emitted from the light-emitting part passes through the print-receiving tape 3A and is received by the light-receiving part. At this time, the print-receiving tape 3A is a three-layer structure comprising the print-receiving layer 3*a*, the adhesive layer 3*b*, and the separation material layer 3*c* in a section where the label mount L is adhered as previously described, and a one-layer structure of only the separation material layer 3*c* in a section where the label mount L is not adhered (in a section between two of the label mounts L). As a result, for example, the end part position of the label mount L in the transport direction is detected as the reference position, based on the difference between the amount of light received in the light-receiving part by the variation in the above described thickness.

Further, the sensor disposing part 102 comprises a substantially horizontal mounting surface 103 for disposing the sensor unit 100, a substantially rectangular-shaped through-hole 104 formed on the mounting surface 103 so as to extend in the above described left-right direction, and a rack member 105 that extends substantially horizontally in the left-right direction on the rear side of the through-hole 104 along the transport direction of the print-receiving tape 3A. The above described sensor main body 101 is mounted to the upper part of the mounting surface 103 in a movable manner along the left-right width direction.

The through-hole 104 comprises a slide hole part 104*a* that extends along the width direction. A pair of rectangular-shaped insertion hole parts 106*a* and 106*b* larger than the width orthogonal to the left-right width direction of the slide hole part 104*a* is formed on the left end side of the slide hole part 104*a*.

Detailed Structure of Sensor Main Body

Figure 16:
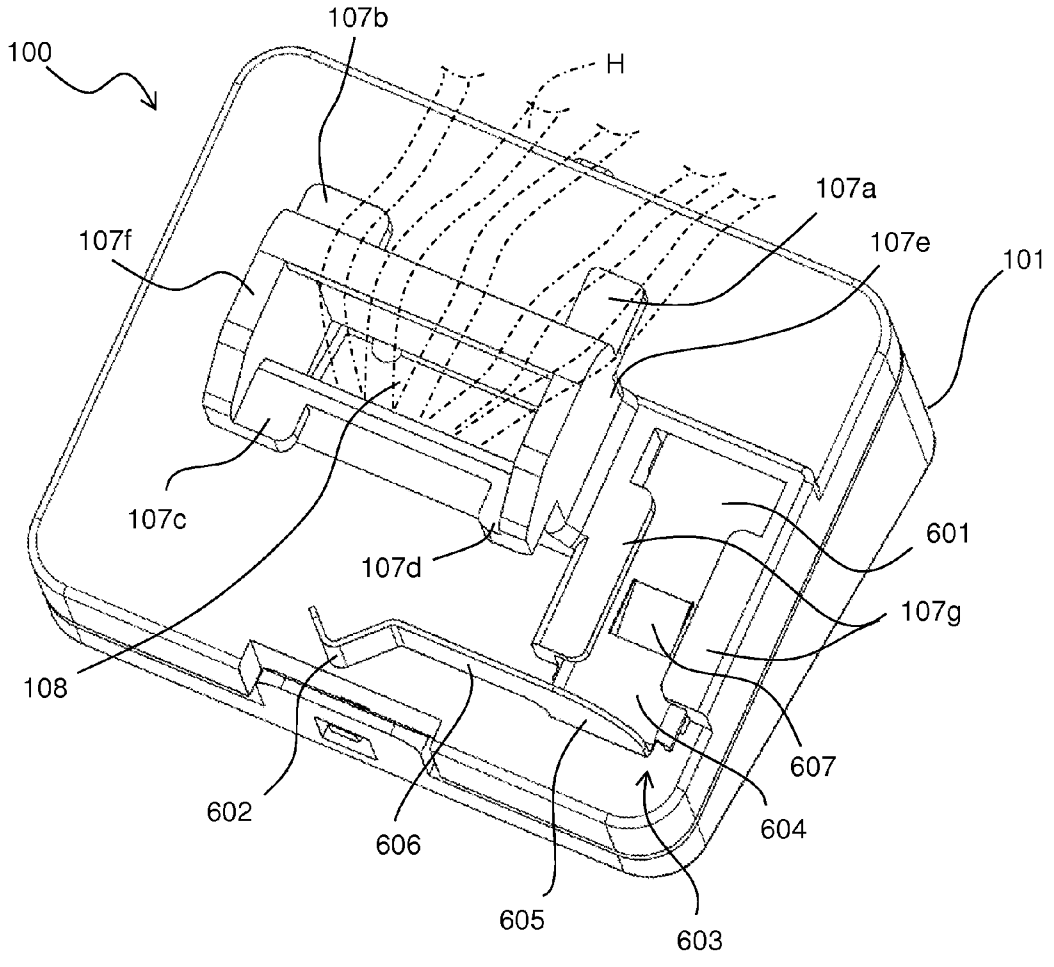
FIG. 16 is a perspective view showing the configuration of the lower side of the sensor main body.

As shown in FIG. 16 and the above described FIG. 15, an engaging foot part 107 with a rectangular protruding shape is provided in a protruding manner through and below the through-hole 104 from the lower part of the sensor main body 101. The engaging foot part 107 comprises a lower end part 107*f* and a middle part 107*e* that connects the sensor main body 101 and the lower end part 107*f*. Further, four retaining parts 107*a*, 107*b*, 107*c*, and 107*d* with a protruding shape are provided in a protruding manner in respective pairs on the front and rear sides between the middle part 107*e* and the lower end part 107*f*.

At this time, a slide hole part 104*a* of the above described through-hole 104 is permitted to pass through the middle part 107*e* and not through the lower end part 107*f* of the engaging foot part 107. On the other hand, the insertion hole part 106*a* of the above described through-hole 104 is permitted to pass through the lower end part 107*f* and the middle part 107*e*. Thus, when the sensor unit 100 is assembled in the manufacturing process, the retaining parts 107*c* and 107*d* are inserted into the insertion hole part 106*a* and the retaining parts 107*a* and 107*b* are inserted in the insertion hole part 106*b* of the end part side of the slide hole part 104*a*. At this time, the above described four retaining parts 107*a*, 107*b*, 107*c*, and 107*d* with a protruding shape engage with the lower part of the mounting surface 103 via the slide hole part 104*a* (refer to FIG. 15). Then, after the lower end part 107*f* is engaged with the lower part of the mounting surface 103, the middle part 107*e* is moved from the insertion hole part 106*a* to the slide hole part 104*a*. In this manner, the sensor main body 101 is installed in a movable manner along the above described left-right direction to the slide hole part 104*a*.

Further, as shown in the above described FIG. 14 (refer to the above described FIG. 4 as well), in this example, a prohibiting member 500 is integrally provided to the housing 2 or a member (a cover member 501 for guiding the discharge of the separation material layer 3*c* in this example; refer to FIG. 4) fixed to the housing 2, on the lower side of the insertion hole part 106*a* side of the slide hole part 104*a*. In the manufacturing process, this prohibiting member 500 is moved to the lower side of the insertion hole part 106*a* side in tandem with the closing motion of a middle lid (not shown) after the engaging foot part 107 in which the lower end part 107*f* is inserted is moved from the insertion hole parts 106*a* and 106*b* to the slide hole part 104*a* as described above. With this arrangement, the middle part 107*e* is prohibited from moving to the insertion hole part 106*a*, and the engagement of the engaging foot part 107 (in other words, the sensor unit 100) with the through-hole 104 is maintained.

Lower Part Structure of Sensor Main Body

As shown in FIG. 16, a pulling out part 108 by which a harness H connected to the above described light-emitting part and light-receiving part is pulled out is provided to a center area in the planar view of the above described engaging foot part 107 with a rectangular protruding shape. Further, a spring member 600 comprising a leaf spring is fixed to a lower part of the sensor main body 101, imparting an elastic force in the substantially horizontal direction for meshing the sensor unit 100 with the above described rack member 105 from the substantially horizontal direction (refer to the bold arrow in FIG. 15). That is, the rack member 105 extends substantially horizontally to the sensor disposing part 102, and the above described spring member 600 imparts an elastic force for meshing the sensor unit 100 with the rack member 105. With this arrangement, the user moves the sensor unit 100 in the width direction while suitably changing the meshing position with the rack member 105 and stops moving the sensor unit 100 at the suitable meshing position, thereby making it possible to easily position the sensor unit 100 manually.

Figure 17:
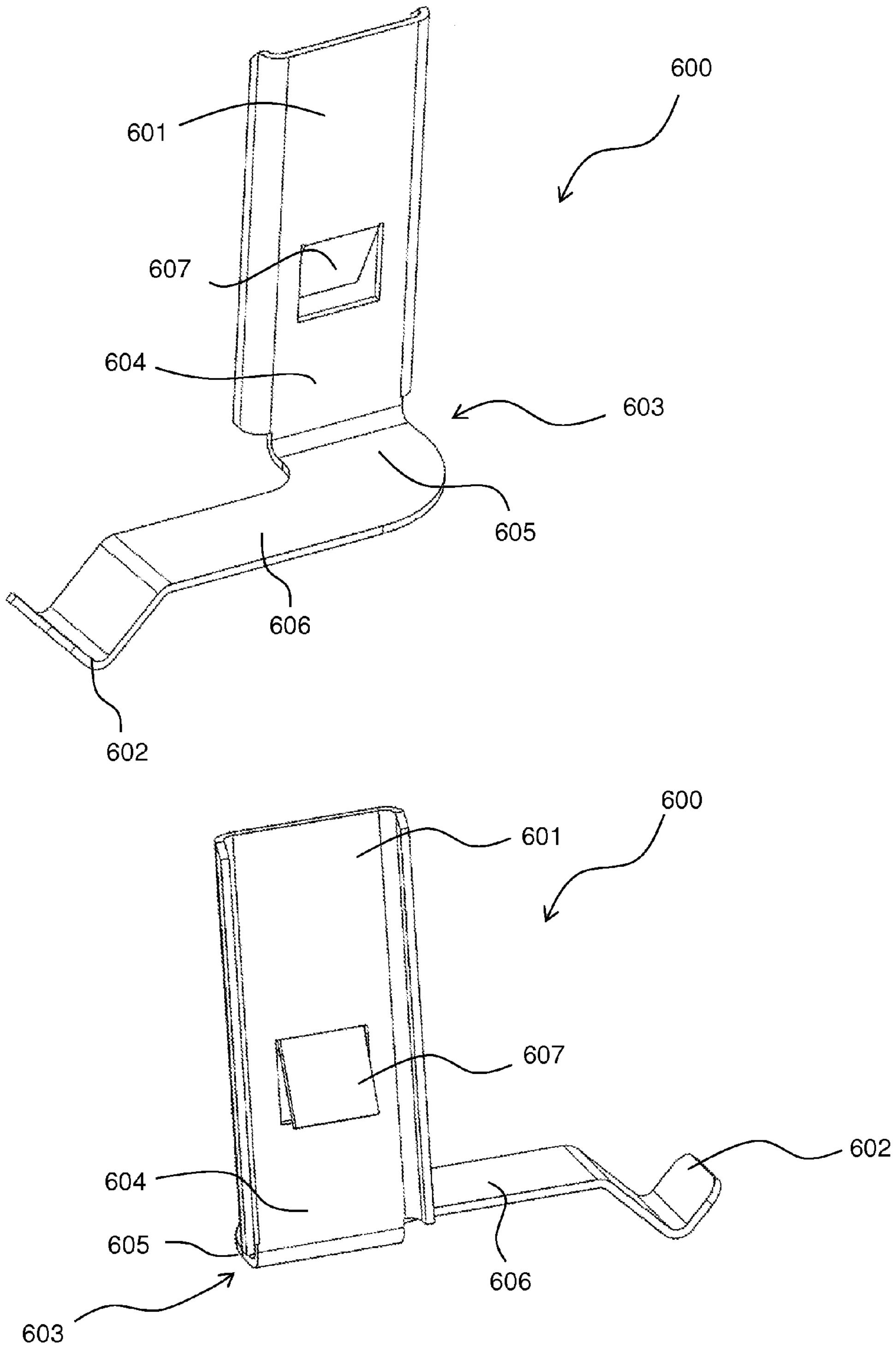
FIG. 17 is a perspective view of the spring member as viewed from the face side, and a perspective view of the spring member as viewed from the back side.

At this time, the spring member 600 is configured in a substantially L shape in the planar view, circumventing the pulling out part 108 and the engaging foot part 107 of the sensor main body 101. At this time, a pair of left and right L-frame shaped insertion frame parts 107*g* that face each other is formed on the lower part of the sensor main body 101. Then, the spring member 600 comprises a base end part 601 mounted and fixed to the above described insertion frame part 107*g*, a tip end part 602 comprising a meshing shape for meshing with the rack member 105 from the substantially horizontal direction, and a middle part 603 that connects consecutively to the base end part 601 so as to connect the tip end part 602 and the base end part 601 and imparts an elastic force in the substantially horizontal direction on the tip end part 602, as shown in FIG. 17 and the above described FIG. 16.

The middle part 603 comprises a horizontal extending part 604 that extends in the substantially horizontal direction along the transport direction below the sensor main body 101, a hanging extending part 605 that curves downward and connects consecutively from this horizontal extending part 604 and hangs and extends downward, and a width extending part 606 that curves and connects consecutively from this hanging extending part 605 in the above described left-right direction and extends in the left-right direction.

The tip end part 602 comprises a protruding shape as a meshing shape corresponding to the interproximal groove shape of the rack member 105. A tongue piece part 607 cut into a substantially cuboid-like shape open to the left is provided to the horizontal extending part 604. When the base end part 601 is inserted into the above described insertion frame part 107*g*, the base end part 601 is held by an elastically repulsive force caused by this tongue piece part 607, thereby preventing a shaky fitting of the spring member 600 and inadvertent disengagement.

Locking Structure of Sheet Cover of Touch Panel

Next, the locking structure of a sheet cover detachably attached to the touch panel 5A of the upper cover unit 5, which is yet another special characteristic of this embodiment, will be described using FIGS. 18-23.

Figure 18:
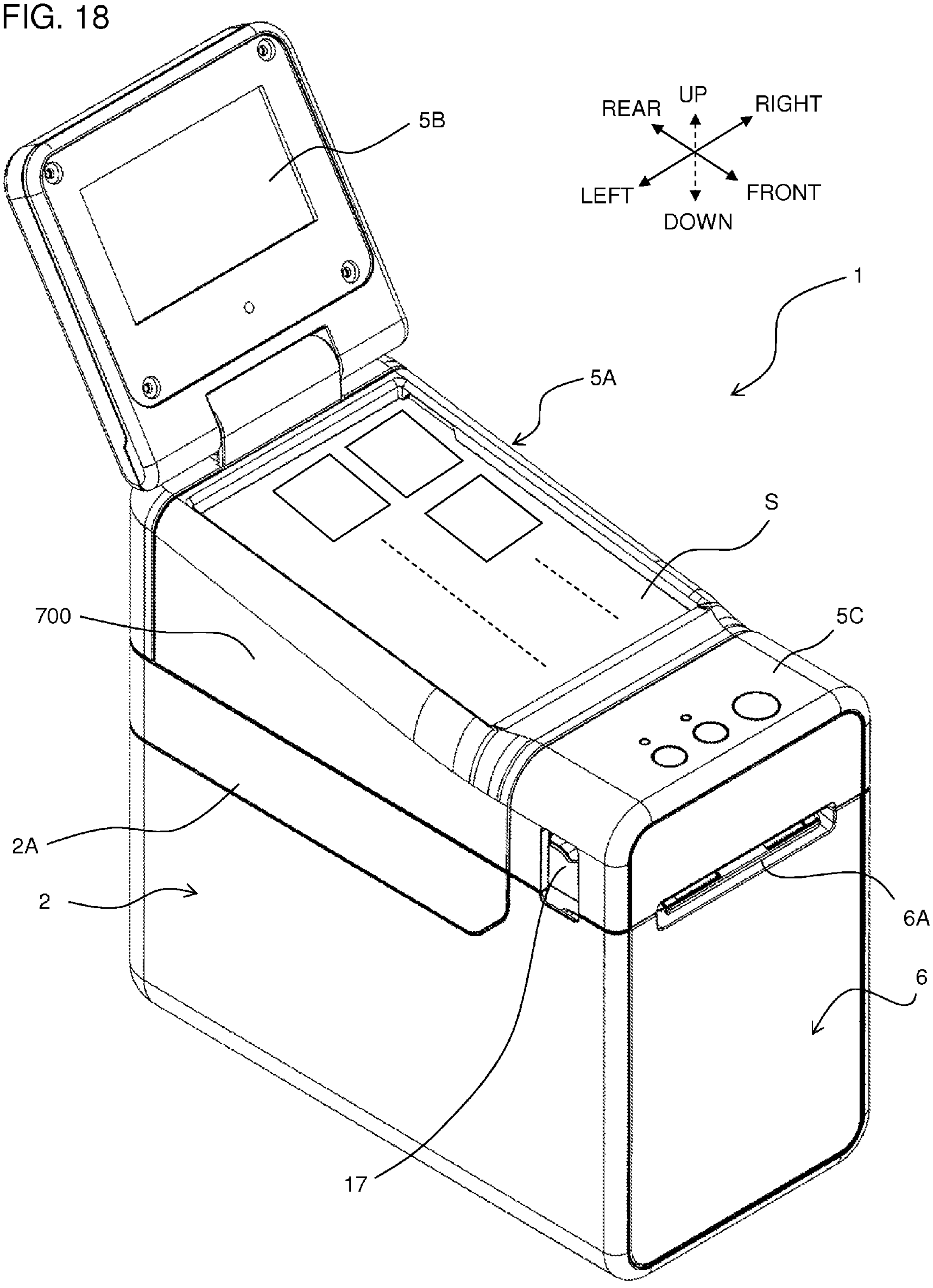
FIG. 18 is a perspective view showing the outer appearance of the label producing apparatus with the operation sheet installed.
Figure 19A:
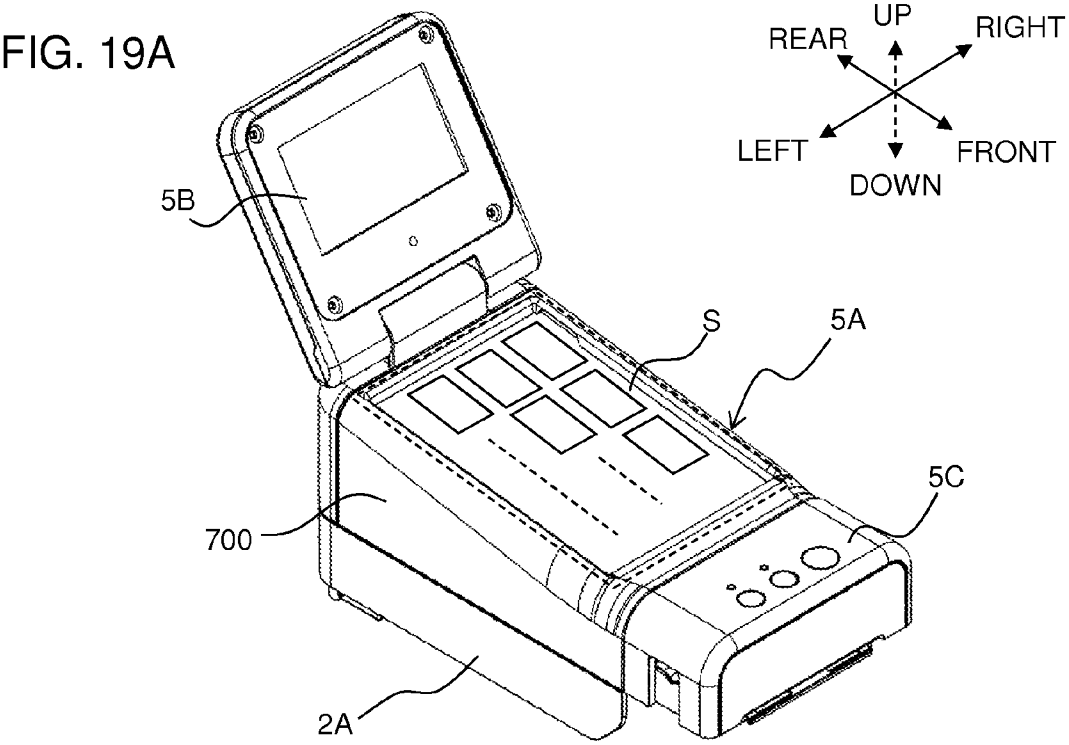
FIG. 19A is a perspective view showing the operation sheet mounted on the touch panel with the sheet cover installed.
Figure 19B:
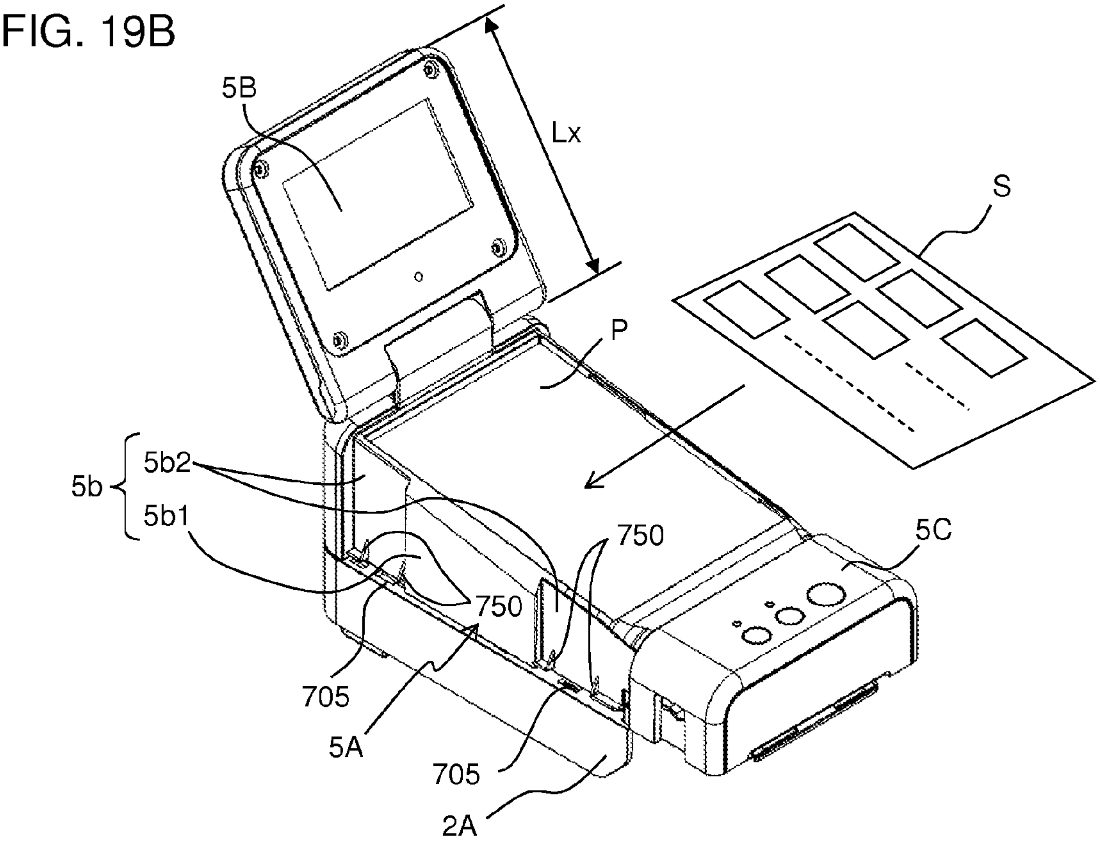
FIG. 19B is a perspective view showing the operation sheet mounted on the touch panel.
Figure 20:
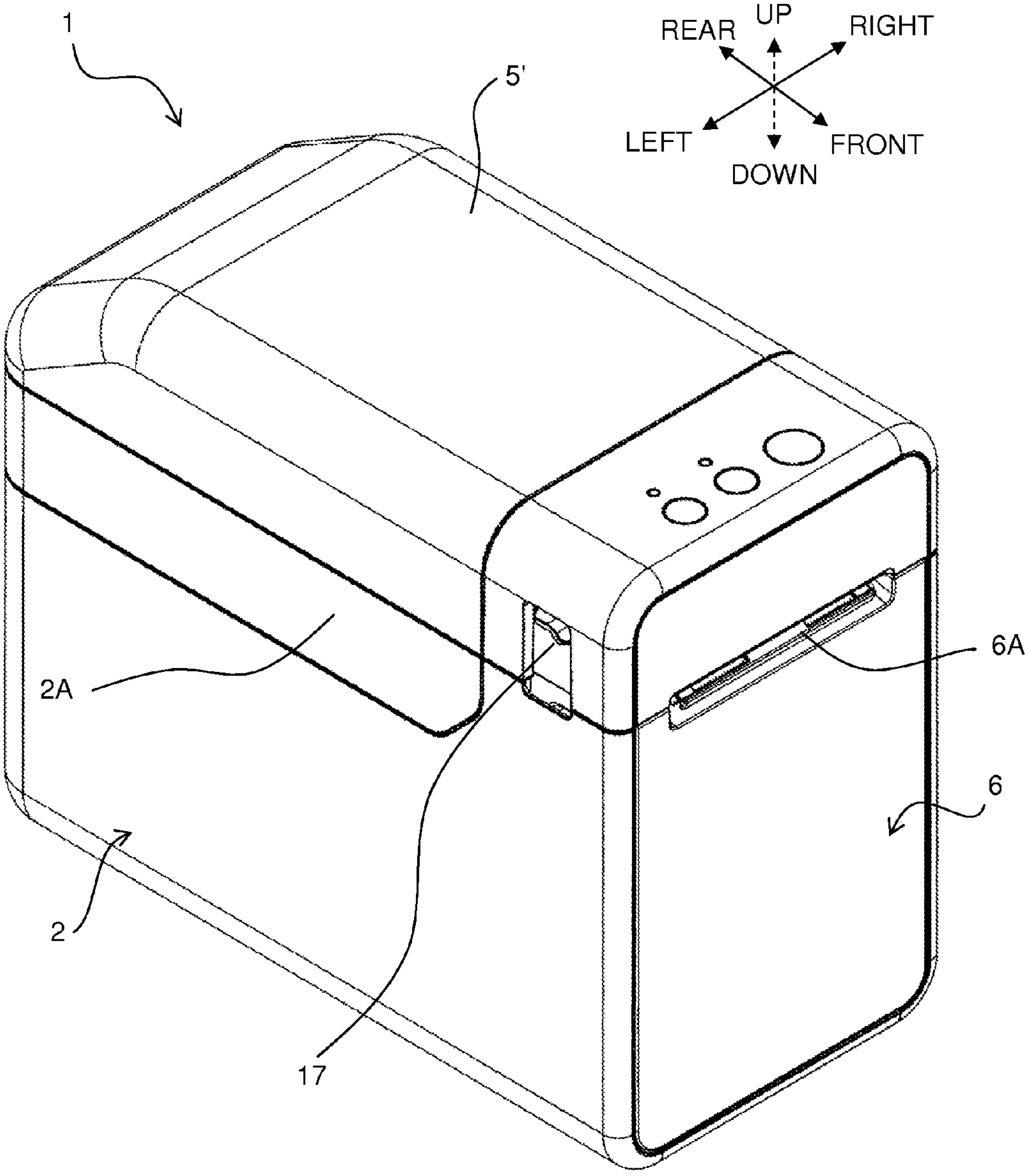
FIG. 20 is a perspective view showing the label producing apparatus with the lid unit installed in place of the upper cover unit.

In FIG. 18 and FIG. 19, the touch panel 5A is provided to the upper part of the above described upper cover unit 5, as previously described. The operator can perform a desired operation input by touching an operation surface P (refer to FIG. 19B) of the touch panel 5A from above using a fingertip, etc. At this time, according to this embodiment, for example, an operation sheet S is mounted on the operation surface P to make it possible to perform the above described operation input smoothly. A plurality of types of the operation sheet S is prepared, and various operation buttons are respectively disposed on each operation sheet S in mutually different arrangements in accordance with user needs and application, for example, Then, to ensure that this operation sheet S does not come off the operation surface P of the touch panel 5A, a sheet cover 700 is detachably provided to the touch panel 5A (or the housing 2). Note that the above described touch panel 5A may comprise optional parts, for example, and a lid unit 5' may cover the upper area of the upper cover unit 5 as shown in FIG. 20, for example, in a form where the touch panel 5A is not used.

Sheet Cover

Figure 21B:
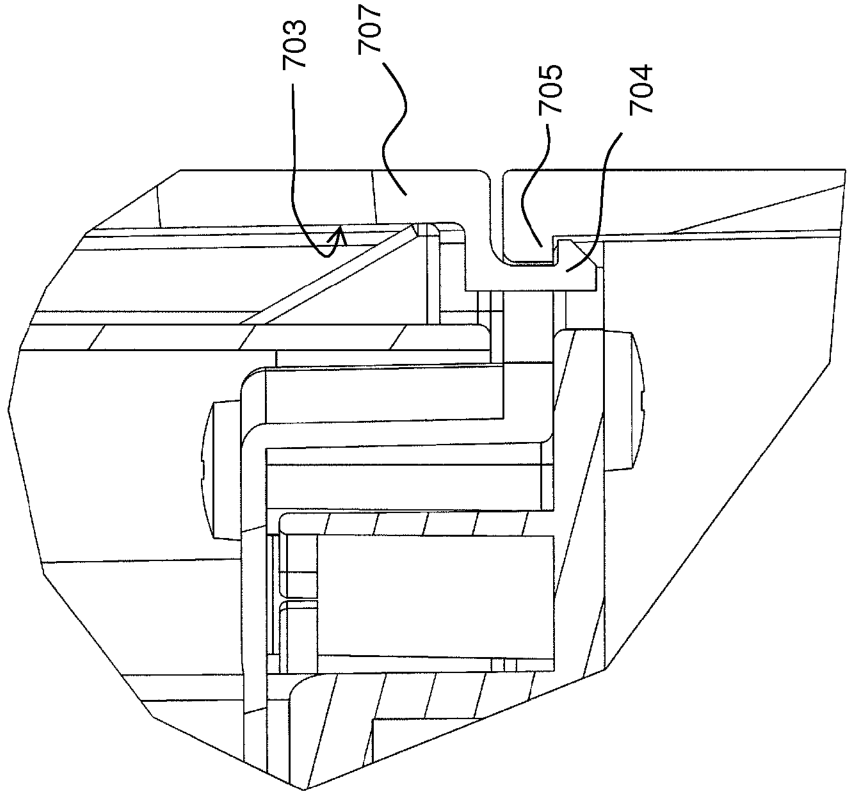
FIG. 21B is an enlarged view of the main part of FIG. 21A.
Figure 21A:
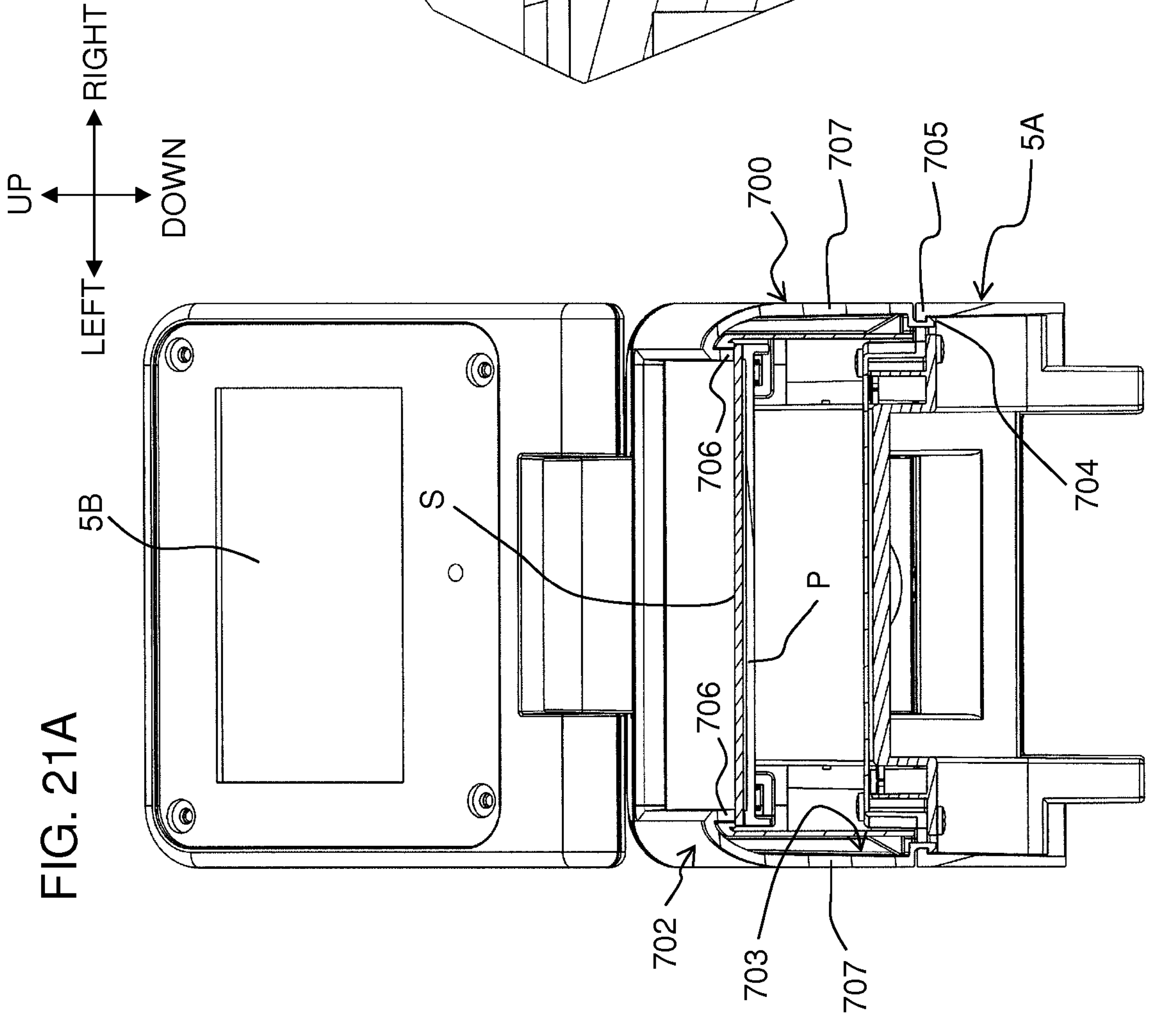
FIG. 21A is a cross-sectional view along a line R-R' in FIG. 1.
Figure 22:
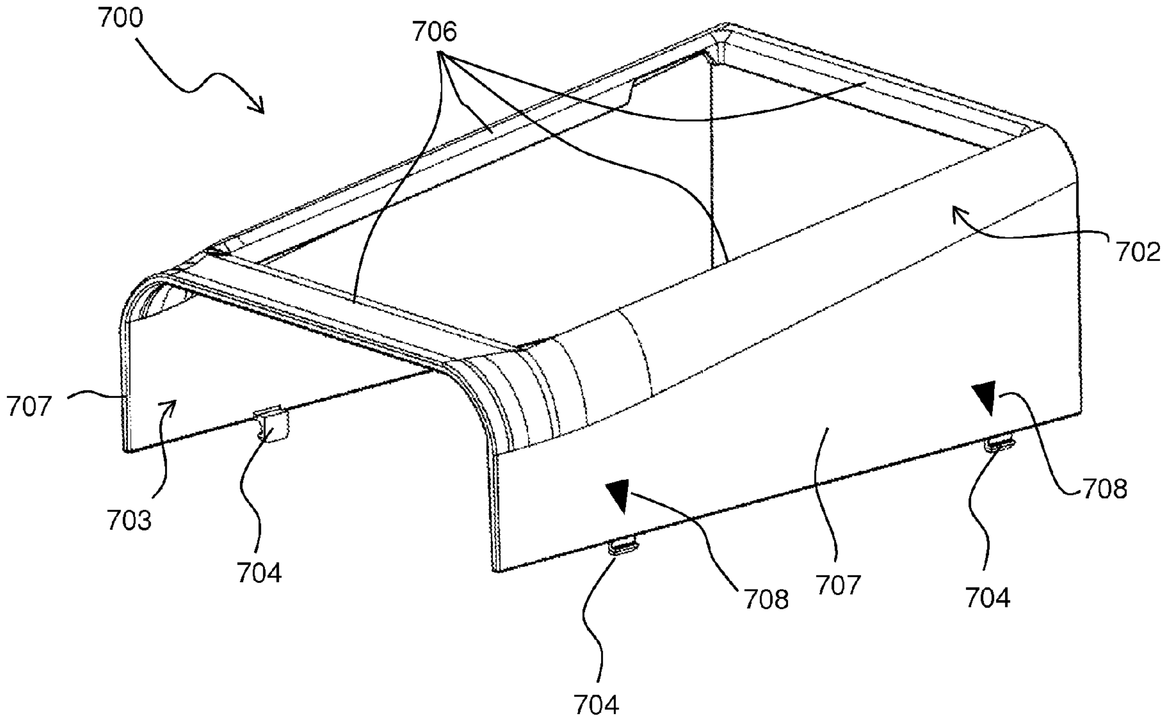
FIG. 22 is a perspective view showing the overall configuration of the sheet cover.

As shown in FIG. 21 and FIG. 22, the sheet cover 700 comprises an outer peripheral surface 702 exposed laterally to the label producing apparatus 1, and an inner peripheral surface 703 that sandwiches the operation sheet S with the operation surface P of the touch panel 5A and at least partially covers the touch panel 5A. That is, as shown in FIG. 19B, the operation sheet S is mounted on the operation surface P of the touch panel 5A, and the sheet cover 700 formed into a cross-sectional substantially cuboid-like shape open to the left is made to cover the operation sheet S. At this time, as shown in FIG. 19A and FIG. 21B, the inner peripheral surface 703 of the sheet cover 700 at least partially covers the touch panel 5A while sandwiching the operation sheet S with the operation surface P. With this arrangement, the plurality of types of the operation sheet S can be suitably replaced and used by removing the sheet cover 700 from the touch panel 5A as necessary.

Figure 23A:
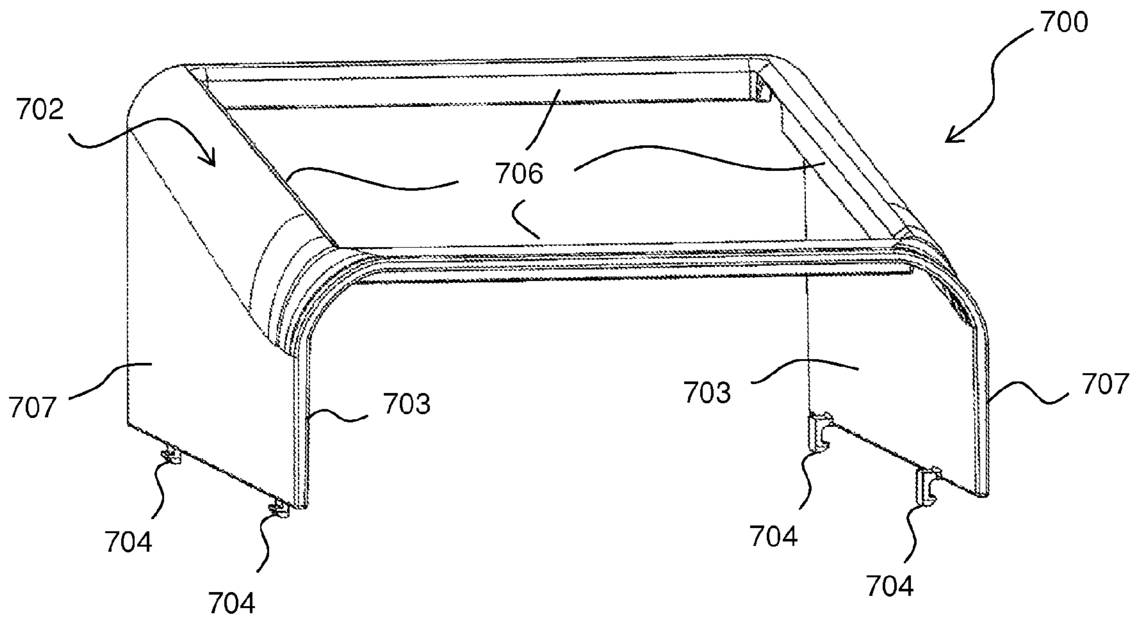
FIG. 23A is a perspective view showing the configuration of the sheet cover.

The sheet cover 700, as shown in FIG. 22, FIG. 23A, and the above described FIG. 21A, comprises a substantially horizontal part 706 positioned on the upper part of the operation sheet S, and a substantially vertical part 707 that hangs substantially vertically downward from each of both end parts along the width direction of the substantially horizontal part 706. The substantially vertical part 707 is provided as a left and right pair to cover each lateral side of the touch panel 5A.

Locking Hook

Figure 23B:
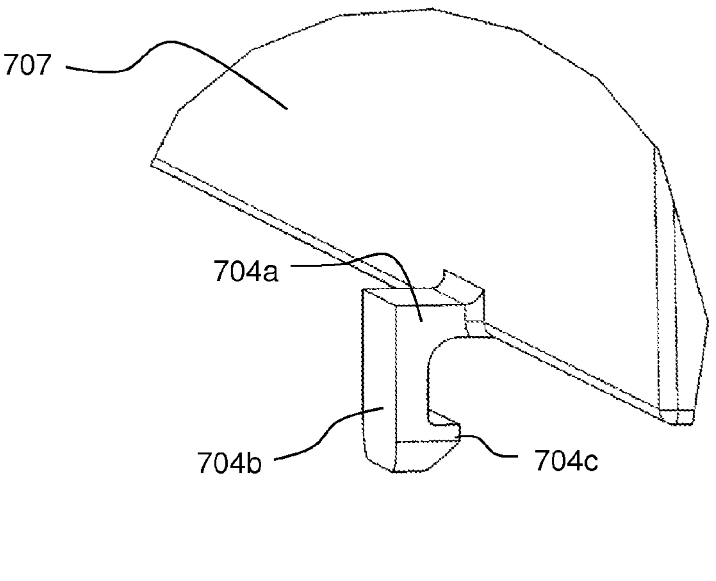
FIG. 23B is an enlarged view of the main part of FIG. 23A.

At this time, according to this embodiment, the sheet cover 700 is configured to be attachable to and detachable from the touch panel 5A for suitable replacement and use of the plurality of types of operation sheets S as described above. That is, a plurality of locking hooks 704 capable of locking to a locked part 705 of the touch panel 5A (or the housing 2) is provided to the respective inner peripheral surfaces 703 of a left and right pair of substantially vertical parts 707. At this time, each of the plurality of locking hooks 704 comprises a base end part 704*a* connected consecutively to the inner peripheral surface 703 of the substantially vertical part 707, a curving part 704*b* provided further on the tip end side than the base end part 704*a*, and a tip end part 704*c* provided further on the tip end side than the curving part 704*b*, facing the apparatus outer side along the width direction, as shown in FIG. 21A and FIG. 23B. Then, the locking to the locked part 705 is releasable by the displacement of the tip end part 704*c* toward the apparatus inner side by the flexure of this substantially vertical part 707.

Disposed Position of Locking Hook

Here, according to the label producing apparatus 1 of this embodiment, as shown in FIG. 1, etc., the housing 2 is configured in a substantially cuboid-like shape, comprising a longitudinal direction (corresponding to the above described front-rear direction) and a width direction (corresponding to the above described left-right direction). Accordingly, the operator may grip the overall apparatus by hand from above to carry the apparatus, for example. According to this embodiment, the above described sheet cover 700 is attachable to and detachable from the touch panel 5A of the upper part of the housing 2, as previously described. Nevertheless, assuming that the operator grips the sheet cover 700 when carrying the apparatus as described above, it is necessary to ensure that the sheet cover 700 does not come off.

Here, according to this embodiment, as shown in FIG. 19B, FIG. 22, etc., avoiding the center part in the above described longitudinal direction that is most likely naturally gripped by the operator during the above described carrying, the above described locking hook 704 is provided to areas other than the center part. Specifically, as previously described, a plurality of (four in this example) locking hooks 704 is provided to an area outside the center part along the longitudinal direction (front-rear direction) on one side and the other side (the left side and the right side), respectively, in the width direction of the inner peripheral surface 703. Then, a plurality of (four in this example) locked parts 705 to which each of the plurality of locking hooks 704 is locked is provided to the touch panel 5A in a corresponding manner. Thus, with the locking hooks 704 and the locked parts 705 disposed avoiding the area likely gripped by the operator, it is possible to prevent the sheet cover 700 from mistakenly coming off the housing 2 or the touch panel 5A when the apparatus is carried by the operator while permitting removal of the sheet cover 700 from the housing 2 or the touch panel 5A at the time of replacement of the operation sheet S. Note that, at this time, as shown in FIG. 22, an indicator 708 (with an upside-down triangle shape in this example) that indicates the existence of the locked part 705 is provided to the outer peripheral area corresponding to the locked part 705 of the sheet cover 700 (omitted in other figures). Note that, in this example, the four locked parts 705 include the two left and right locked parts 705 positioned on the rearward side (refer to the locked part 705 shown on the left back side in FIG. 19B), and the locked parts 705 positioned on the frontward side (refer to the locked part 705 shown on the right front side in FIG. 19B). Then, a dimension Lx of the above described liquid crystal panel part 5B in a direction substantially along the above described front-rear direction is set so that, in a state where the liquid crystal panel part 5B is lowered, covering the touch panel 5A (refer to FIG. 2), the liquid crystal panel part 5B reaches the area above the locked parts 705 on the above described rearward side but not the area above the locked parts 705 positioned on the above described frontward side.

Further, at this time, the touch panel 5A comprises left and right side surface parts 5*b* (only the side surface part 5*b* on the left side is shown in FIG. 19B) covered by the above described substantially vertical part 707 when the sheet cover 700 is mounted. Then, each of the side surface parts 5*b* is formed into a step structure comprising a contact part 5*b*1 contacted by the inner peripheral surface of the substantially vertical part 707 when the sheet cover 700 is mounted, and recessed parts 5*b*2 and 5*b*2 respectively provided near the locked parts 705 and 705, receded further along the left-right direction than the contact part 5*b*1. With this arrangement, when the operator grips the sheet cover 700 as described above, the vertical part 707 reliably contacts the contact part 5*b*1, making it possible to more reliably prevent the sheet cover 700 from mistakenly coming off the housing 2 or the touch panel 5A.

Further, an oblique rib 750 that protrudes obliquely toward the outward side along the left-right direction, from above to below, is provided to the above described recessed part 5*b*2. With this arrangement, when the sheet cover 700 is removed from the housing 2 or the touch panel 5A during the replacement of the operation sheet S as previously described, the inner peripheral surface of the substantially vertical part 707 contacts the top of the oblique rib 750 after the locking hooks 704 are disengaged from the locked parts 705, causing an upward force to act on the sheet cover 700. As a result, the sheet cover 700 can be easily removed.

Mounting Structure of Battery Power Supply Unit

Next, the mounting structure of the battery power supply unit to the bottom part of the housing 2, which is yet another special characteristic of this embodiment, will be described using FIGS. 24-28. Note that each figure in the following (FIG. 24, FIG. 26, FIG. 30, FIG. 31, FIG. 32, and FIG. 33, in particular) shows an example where the above described lid unit 5' is mounted in place of the above described touch panel unit 5A.

Interface Part of Housing Lower Part

The label producing apparatus 1 of this embodiment, as previously described, contains a plurality of moving devices in the interior of the housing 2, including the above described platen roller 66 that feeds the print-receiving tape 3A and the above described print head 61 that performs desired printing on the print-receiving tape 3A. This plurality of moving devices receives power from an external power supply apparatus 900 (refer to FIG. 28 described later) for movement.

Figure 24:
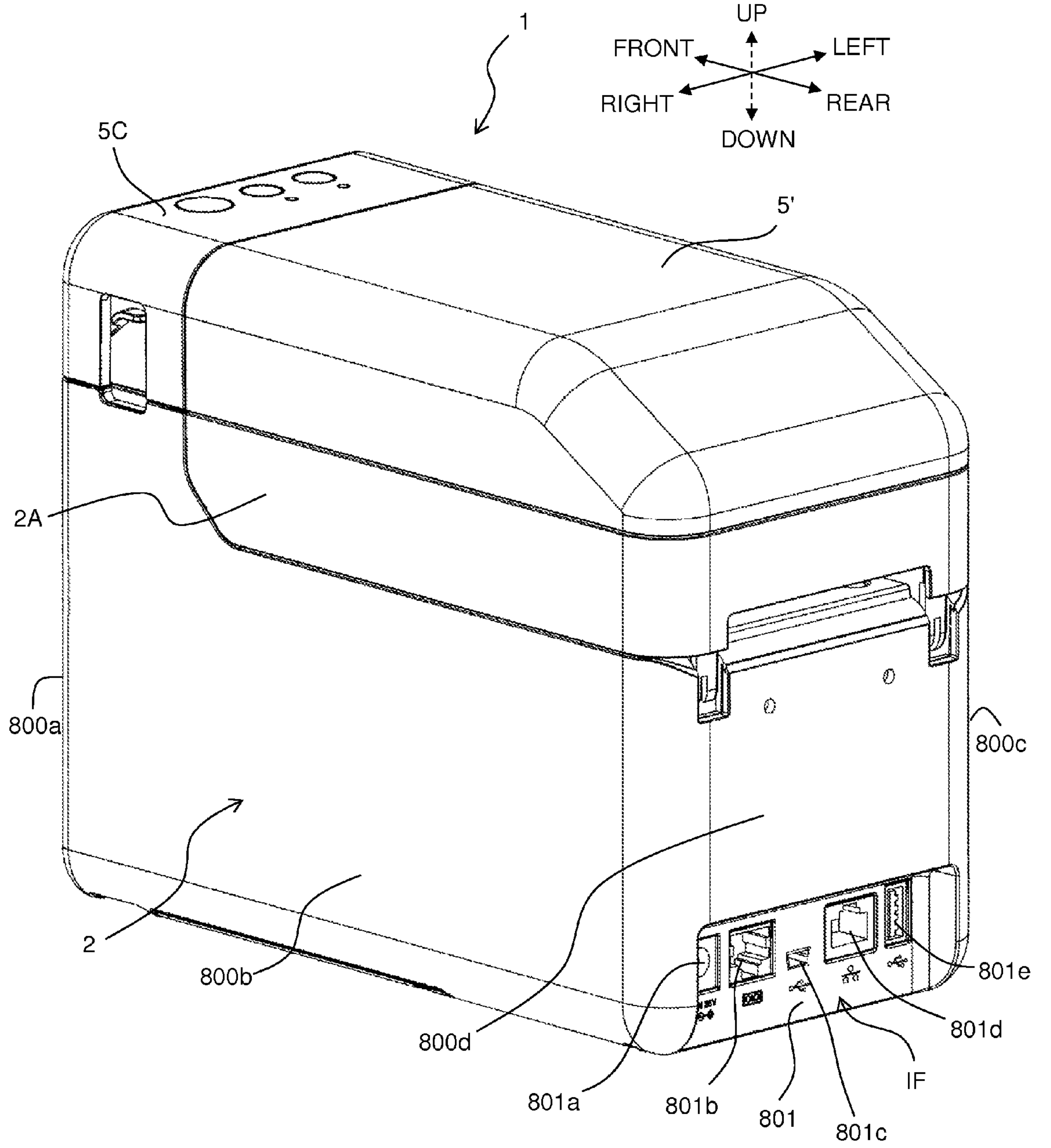
FIG. 24 is a perspective view showing the outer appearance of the label producing apparatus with the lid unit installed, as viewed from the rearward side.

At this time, as shown in FIG. 24, the housing 2 is substantially cuboid-like in shape, comprising a total of four surfaces including a front side surface 800*a*, a right side surface 800*b*, a left side surface 800*c*, and a rear side surface 800*d*. Then, a recessed part 801 is formed on the lower side of the rear side surface 800*d*. An interface part IF comprising a plurality of connection jacks, including a connection jack for the above described power supply, is provided inside this recessed part 801, facing the outside of the housing 2 (refer to FIG. 28 described later as well).

Figure 25A:
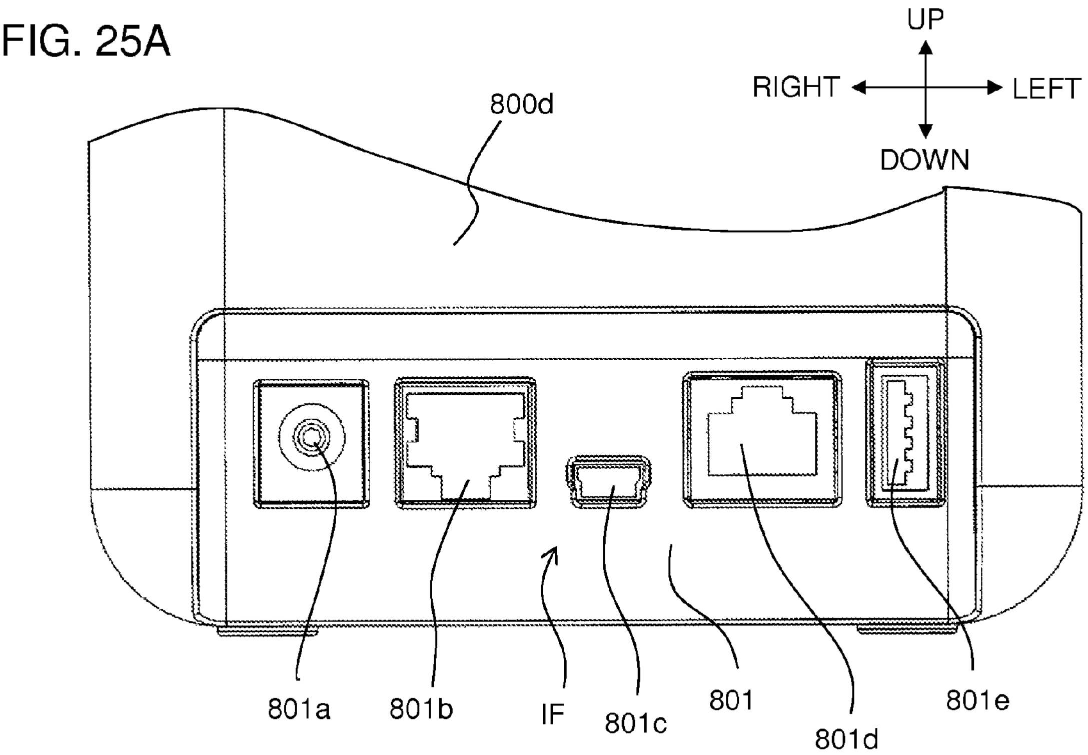
FIG. 25A is a rear view of the label producing apparatus with the battery power supply unit removed from the bottom part.

That is, as shown in FIG. 25A and the above described FIG. 24, a first power supply connection jack 801*a* (in other words, a DC jack), a serial connection jack 801*b* of a so-called RJ25 type, for example, a second USB connection jack 801*c* for functioning as a so-called USB host, a LAN cable connection jack 801*d* of a so-called network RJ45 type, for example, and a first USB connection jack 801*e* for functioning as a so-called USB function are arranged side-by-side in that order from the above described right side to the above described left side on the interface part IF.

During normal periods, as shown in FIG. 24, the first power supply connection jack 801*a* provided to the above described interface part IF is open (refer to the above described FIG. 25A as well). Then, an external power supply connection plug 900*a* (refer to FIG. 28 described later) of the external power supply apparatus 900 is connected, thereby supplying power to each moving device from the external power supply apparatus 900 (refer to FIG. 28 described later) via the first power supply connection jack 801*a*.

Battery Power Supply Unit

Figure 26:
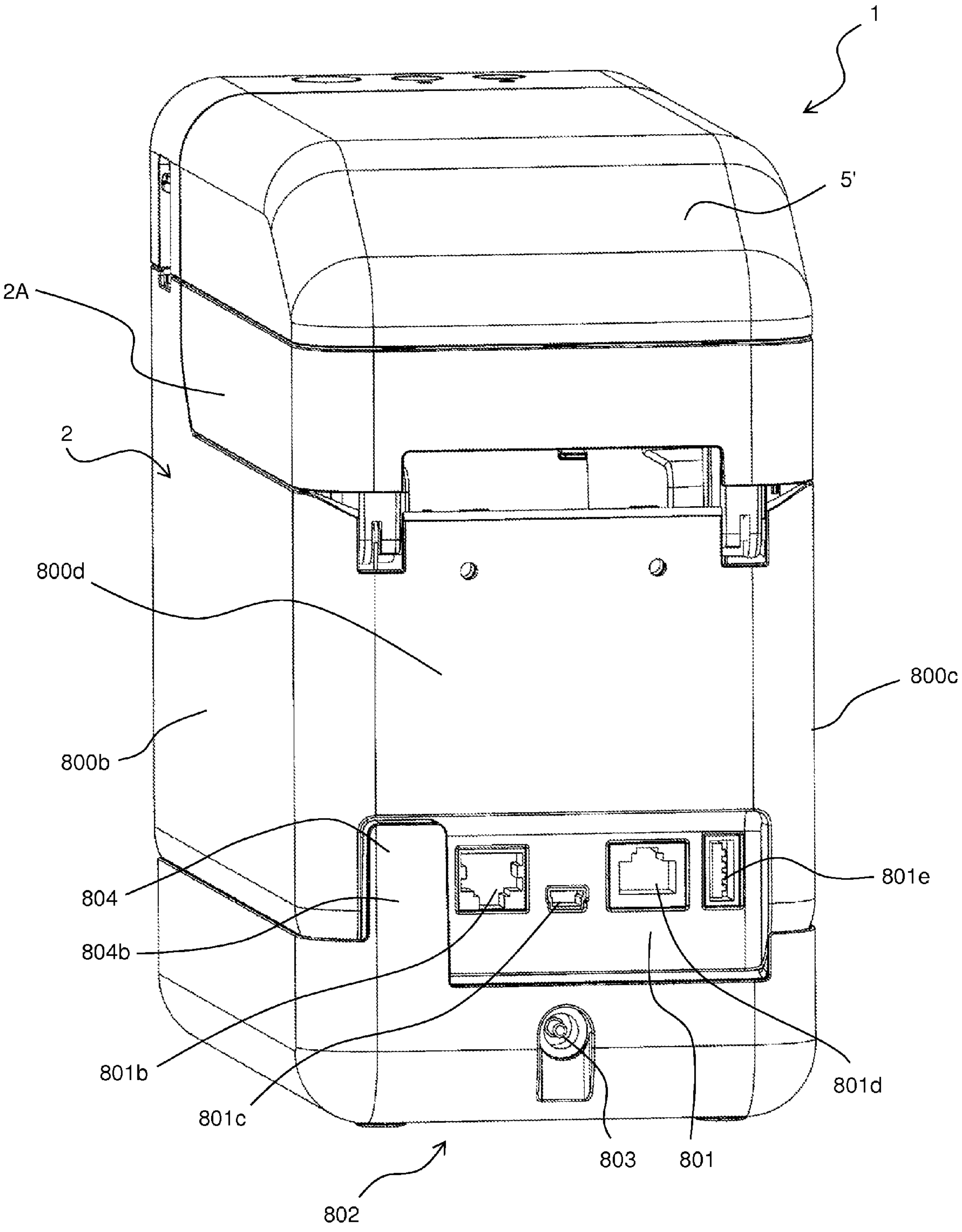
FIG. 26 is a perspective view showing the battery power supply unit installed to the bottom part.

Here, according to the label producing apparatus 1 of this embodiment, a battery power supply unit 802 can be mounted to the bottom part of the housing 2, as shown in FIG. 26. When this battery power supply unit 802 is mounted, a battery power supply BT (refer to FIG. 28 described later) provided inside the battery power supply unit 802 supplies power to each moving device. That is, a second power supply connection jack 803 which has the same function as the above described first power supply connection jack 801*a* is provided to the battery power supply unit 802. Connecting the above described external power supply apparatus 900 to this second power supply connection jack 803 makes it possible to supply and charge power to the above described battery power supply BT of the battery power supply unit 802 from the external power supply apparatus 900 via the second power supply connection jack 803.

Figure 27A:
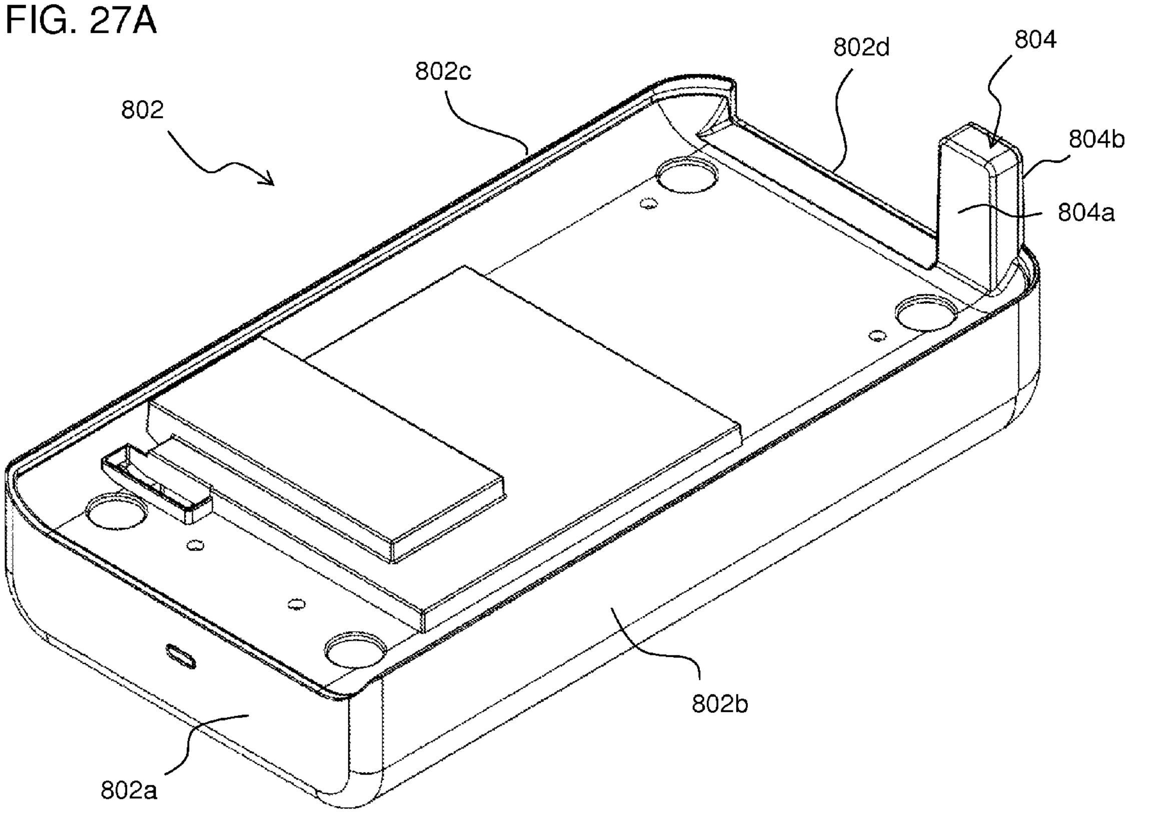
FIG. 27A is a perspective view of the battery power supply unit as viewed from the upper frontward side.
Figure 27B:
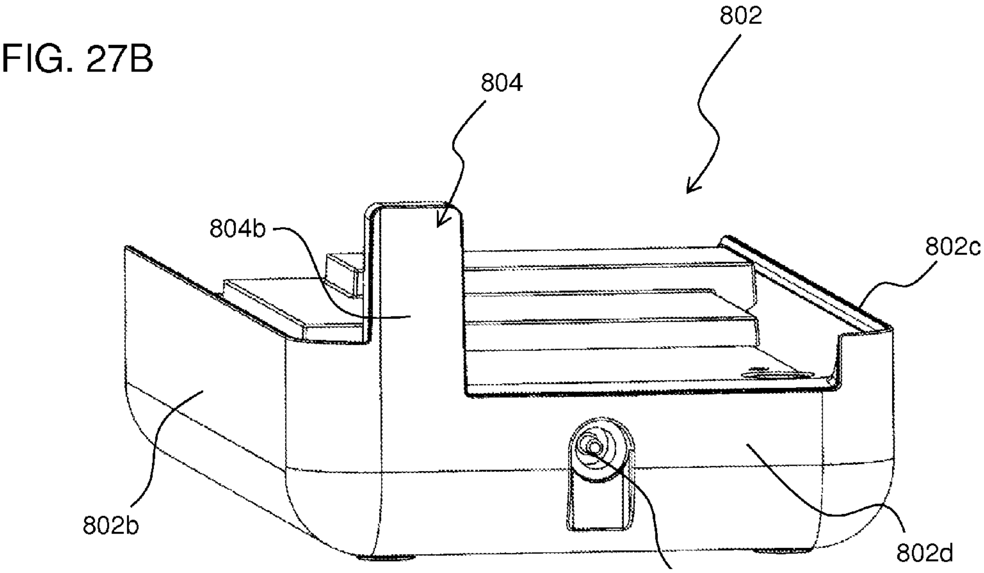
FIG. 27B is a perspective view of the battery power supply unit as viewed from the upper rearward side.

The battery power supply unit 802 comprises a total of four surfaces, including a front side surface 802*a*, a right side surface 802*b*, a left side surface 802*c*, and a rear side surface 802*d*, as shown in FIG. 27A, FIG. 27B, and the above described FIG. 26. When the battery power supply unit 802 is mounted to the bottom part of the housing 2 as described above, the front side surface 802*a*, the right side surface 802*b*, the left side surface 802*c*, and the rear side surface 802*d* of the battery power supply unit 802 are substantially on the same respective planes as the front side surface 800*a*, the right side surface 800*b*, the left side surface 800*c*, and the rear side surface 800*d* of the above described housing 2. Then, as shown in FIG. 27B, the above described second power supply connection jack 803 is provided to the center of the rear side surface 802*d* of the battery power supply unit 802 as shown in FIG. 27B.

Control System

Next, the control system of the label producing apparatus 1, including the power supply path from the above described external power supply apparatus 900 and the battery power supply unit 802, will be described using FIG. 28.

Figure 28:
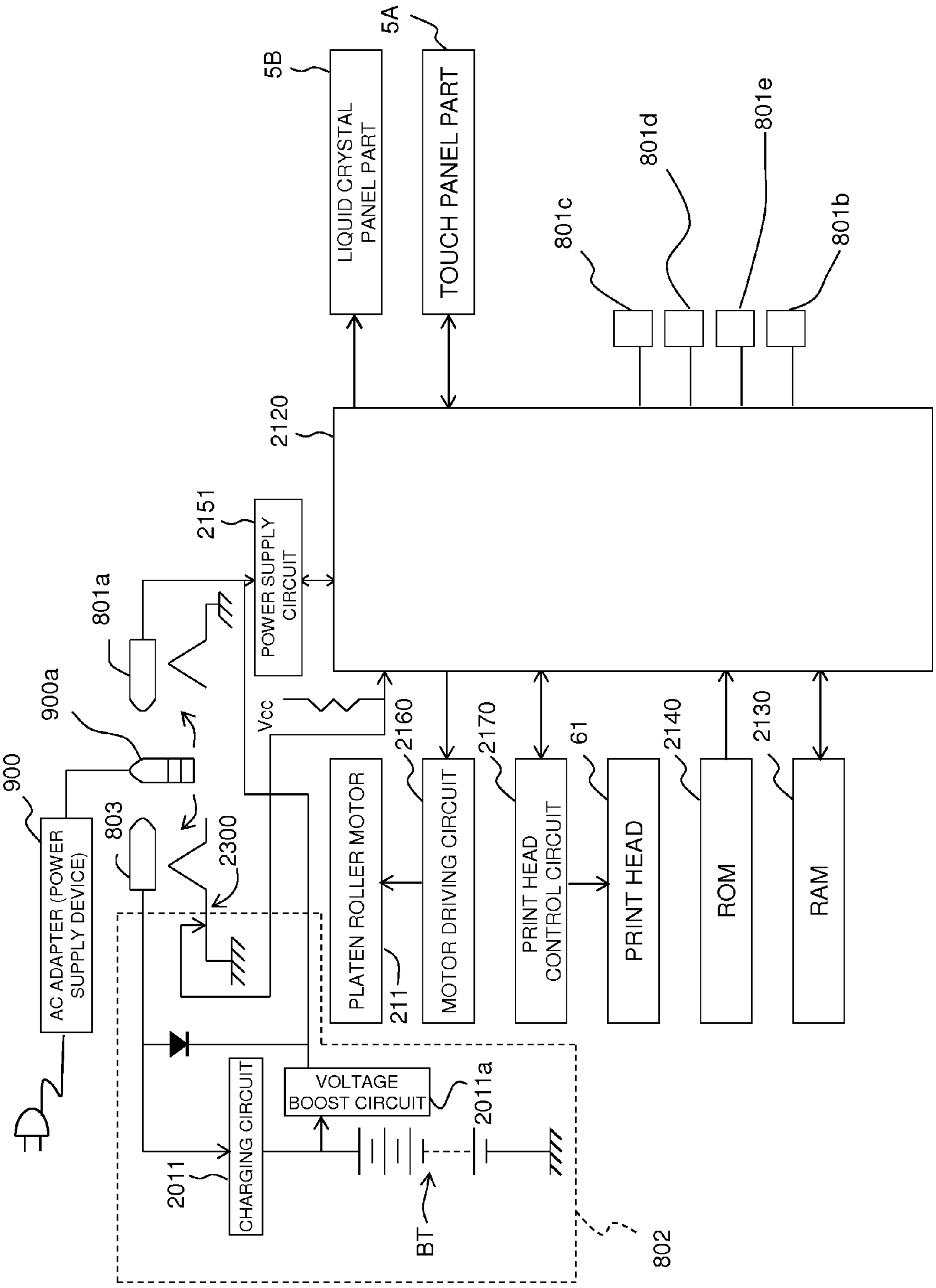
FIG. 28 is a functional block diagram showing the control system of the label producing apparatus.

In FIG. 28, a power supply circuit 2151 for performing the power supply ON and OFF processing of the label producing apparatus 1 is provided to the label producing apparatus 1. Further, the battery power supply unit 802 comprises a charging circuit 2011, a voltage boost circuit 2011*a*, and the battery power supply BT made of a lithium ion battery of a rating of 14 [V], for example.

Further, the label producing apparatus 1 comprises a CPU 2120 that constitutes an operation part that performs predetermined operations. The CPU 2120 performs signal processing in accordance with a program stored in advance in a ROM 2140 while utilizing the temporary storage function of a RAM 2130, and controls the entire label producing apparatus 1 accordingly. The ROM 2140 stores a control program for executing a battery power supply BT charging process and a label producing process. This CPU 2120 is connected to a motor driving circuit 2160 that drives and controls the above described platen roller motor 211 that drives the above described platen roller 66, a print head control circuit 2170 that controls the conduction of the heating elements of the above described print head 61, and a battery detection circuit 2300.

Then, the above described first power supply connection jack 801*a* of the above described interface part IF is connected to the above described power supply circuit 2151. When the external power supply connection plug 900*a* (a so-called DC plug) of the external power supply apparatus 900 of an AC adapter, etc., is connected to the above described first power supply connection jack 801*a*, power is supplied from the external power supply apparatus 900 to the power supply circuit 2151.

On the other hand, with the battery power supply unit 802 installed to the bottom part of the housing 2 and the external power supply connection plug 900*a* not connected to the second power supply connection jack 803 of the battery power supply unit 802, the above described battery detection circuit 2300 detects that the apparatus is battery driven and the mode changes to a battery driven control mode based on the control of the CPU 2120. Further, at this time, in the voltage boost circuit 2011*a*, the rated voltage (14 [V] in the example described above) from the battery power supply BT is boosted to a predetermined voltage (25 [V], for example) and power is supplied to the above described power supply circuit 2151.

Further, the aforementioned liquid crystal panel part 5B, the touch panel 5A, the serial connection jack 801*b*, the first USB connection jack 801*c*, the LAN cable connection jack 801*d*, the second USB connection jack 801*e*, the ROM 2140, and the RAM 2130 are connected to the CPU 2120.

Misconnection of Power Supply Terminal

Here, as previously described, the above described first power supply connection jack 801*a* is provided to the housing 2 side, and the above described second power supply connection jack 803 is provided to the battery power supply unit 802 as well. Accordingly, when the battery power supply unit 802 is mounted to the housing 2 as previously described, the operator may mistakenly connect the external power supply connection plug 900*a* of the external power supply apparatus 900 to the first power supply connection jack 801*a* (though it should be connected to the second power supply connection jack 803). With this connection, charging the battery power supply BT is not possible.

Shielding Member

Hence, according to this embodiment, a shielding member 804 is provided to the battery power supply unit 802. That is, as shown in the above described FIG. 26, FIG. 27A, and FIG. 27B, the shielding member 804 with an oblong block shape is provided to a position corresponding to the disposed position of the first power supply connection jack 801*a* of the above described interface part IF on the upper edge part of the rear side surface 802*d* of the battery power supply unit 802. The shielding member 804 is inserted into the above described recessed part 801 of the lower part of the housing 2 when the battery power supply unit 802 is mounted to the housing 2 as described above.

Then, the shielding member 804 comprises a face surface part 804*b* on substantially the same plane as the above described rear side surface 802*d* of the housing 2, and a back surface part 804*a* that is provided to the side opposite the above described face surface part 804*b*, facing the receiving side of the above described external power supply connection plug 900*a*, when inserted into the above described recessed part 801.

Figure 25B:
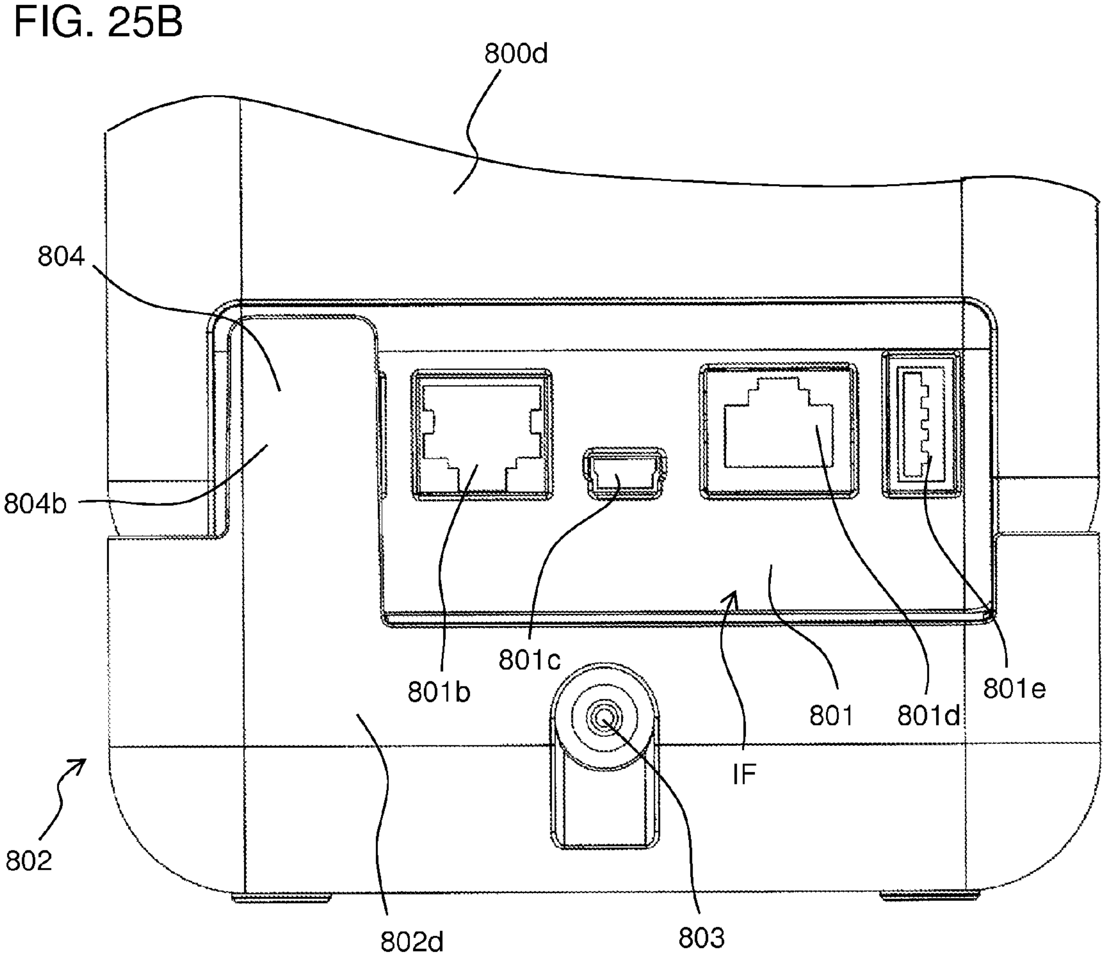
FIG. 25B is a rear view of the label producing apparatus with the battery power supply unit mounted to the bottom part.

That is, when the battery power supply unit 802 is mounted to the bottom part of the above described housing 2, as shown in FIG. 25B, the shielding member 804 is positioned on the receiving side of the external power supply connection plug 900*a* of the first power supply connection jack 801*a*, at least partially shielding the receiving side (slightly exposing the above described left side end part of the first power supply connection jack 801*a* in the example of FIG. 25B). Further, the shielding member 804 exposes the remaining part of the above described receiving side. On the other hand, when the battery power supply unit 802 is disengaged from the bottom part of the housing 2, the shielding member 804 separates from the receiving side of the external power supply connection plug 900*a* of the first power supply connection jack 801*a*, thereby suspending the above described shielding, as shown in FIG. 25A.

Attaching and Detaching the Wireless Communication Unit

Next, the attachment and detachment of the wireless communication unit, which is yet another special characteristic of this embodiment, will be described using FIGS. 29-33.

According to this embodiment, a wireless communication unit 1000 that performs mutually recognized wireless communication such as Bluetooth (registered trademark), for example, is mounted to the housing 2, making it possible to perform wireless communication with external devices and execute information transmission and reception of the above described print data, etc., for example (refer to FIG. 30, etc., described later).

Details of Wireless Communication Unit

Figure 29A:
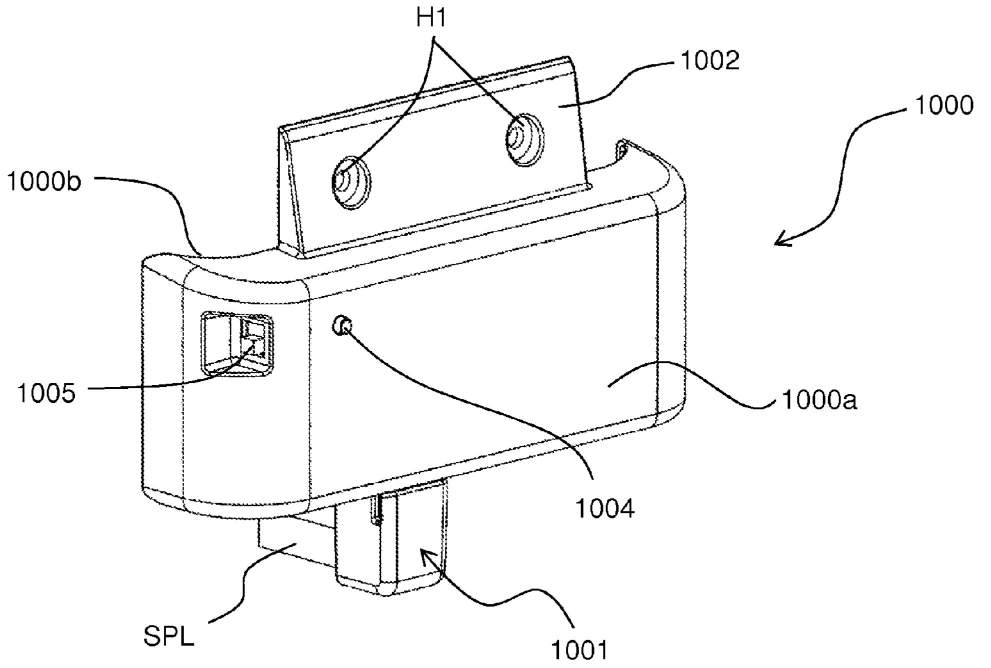
FIG. 29A is a perspective view showing the wireless communication unit comprising a serial connection plug.
Figure 29B:
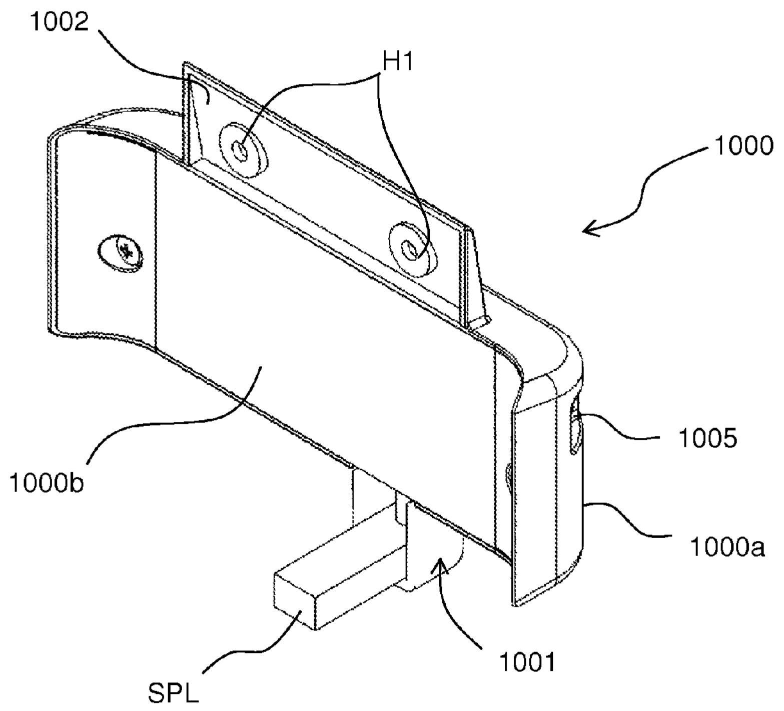
FIG. 29B is a perspective view showing the wireless communication unit comprising a serial connection plug.

The wireless communication unit 1000, as shown in FIG. 29, comprises a back side surface 1000*b* that is formed into a curved surface shape that substantially matches the above described rear side surface 800*d* of the aforementioned housing 2, and a face side surface 1000*a* that is formed into the substantially same curved surface shape as the curved surface of the above described rear side surface 800*d* of the housing 2. Further, a unit coupling device 1001 integrally extends to a location corresponding to the position of the above described serial connection jack 801*b* of the above described interface part IF of the housing 2, on the lower edge side of the wireless communication unit 1000. Furthermore, an installation base part 1002 comprising a screw hole H1 for fixing the wireless communication unit 1000 by a screw N1 to the rear side surface 800*d* of the housing 2 is provided to the upper edge side of the wireless communication unit 1000.

The above described unit coupling device 1001 comprises a serial connection plug SPL in which a gripping hook part is oriented downward so as to be inserted into the above described serial connection jack 801*b*, and a serial cable (not shown) that connects the serial connection plug SPL and the above described wireless communication unit 1000.

Note that a power supply indicator 1004 of an LED lamp, etc., for example, that indicates the power supply ON state of the wireless communication unit 1000 is provided to the above described face side surface 1000*a*. Further, a conduction switch 1005 for turning the switch ON and OFF when performing wireless communication with external devices is provided to a corner location of the face side surface 1000*a*.

Connection Using a Jack Connection

Figure 30:
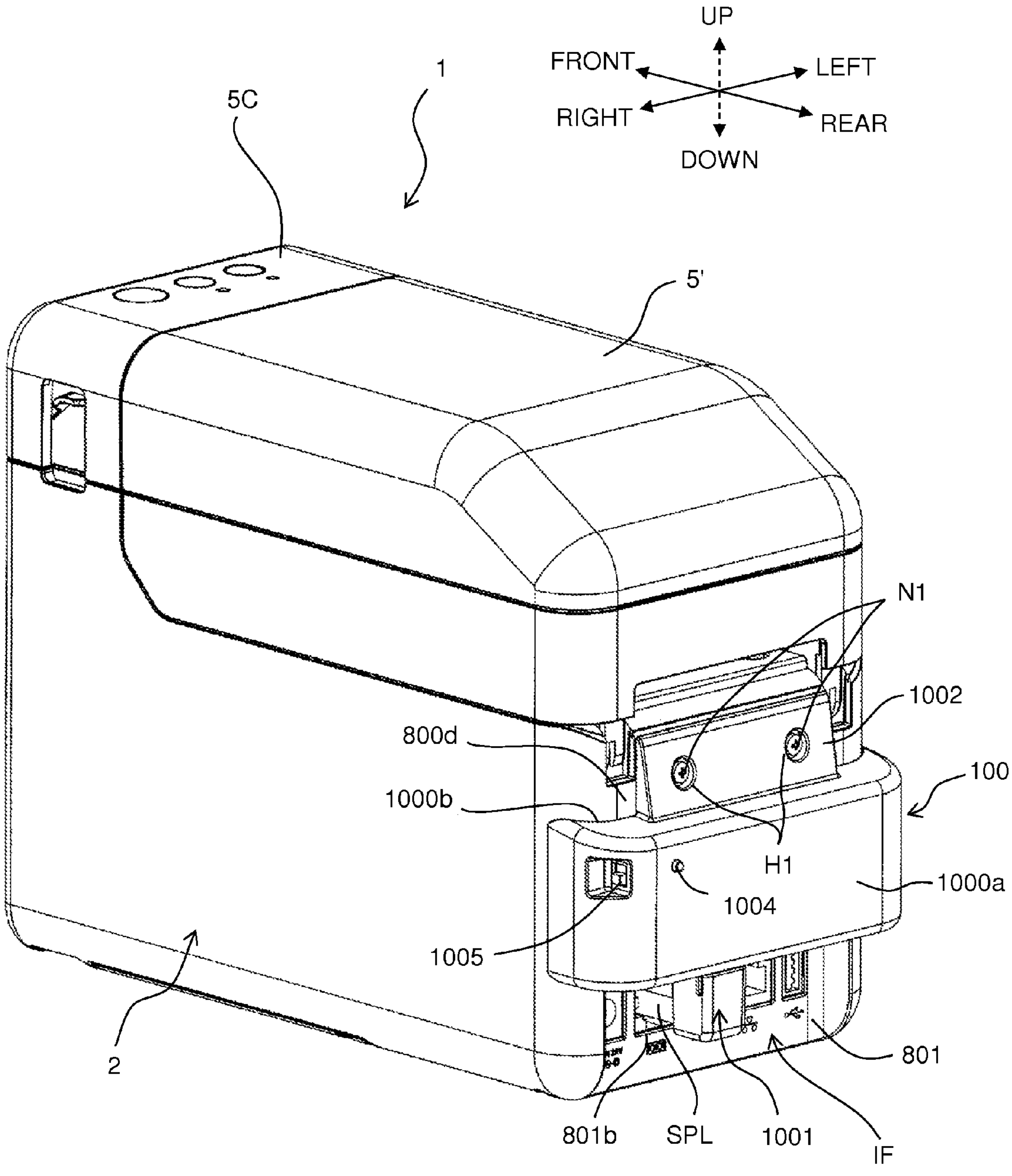
FIG. 30 is a perspective view showing the outer appearance of the label producing apparatus with the wireless communication unit shown in FIG. 29 installed, as viewed from the rearward side.
Figure 31A:
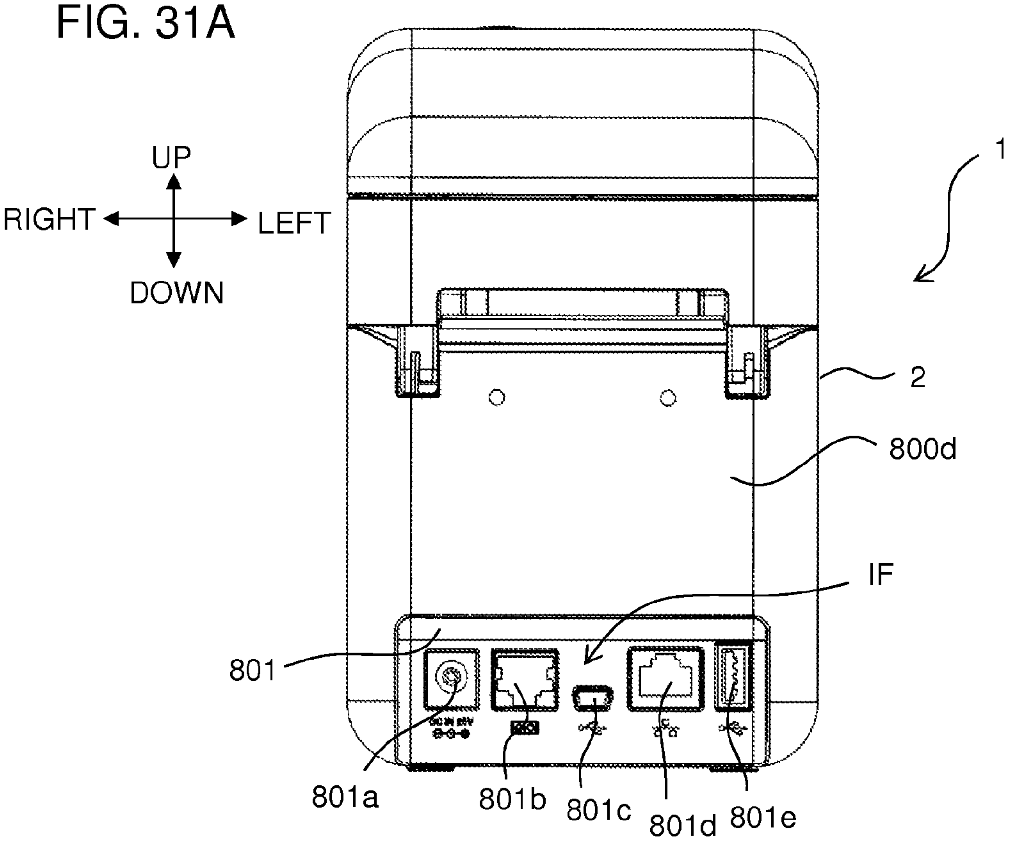
FIG. 31A is a rear view of the label producing apparatus with the wireless communication unit not mounted.
Figure 31B:
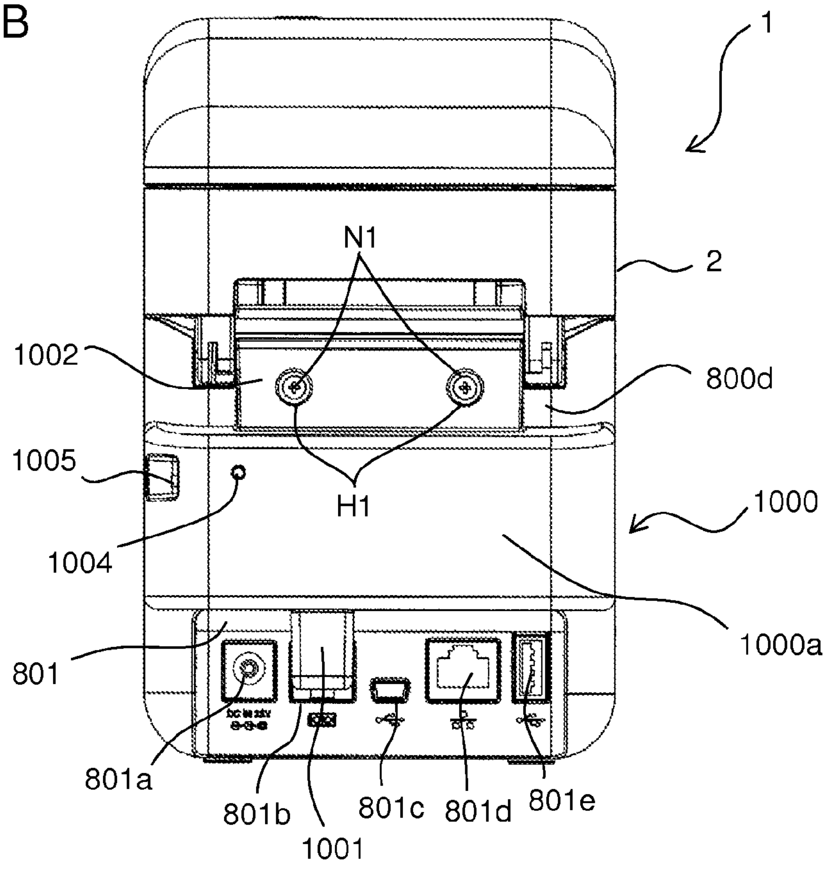
FIG. 31B is a rear view of the label producing apparatus with the wireless communication unit mounted to the back surface part.

The wireless communication unit 1000 of the above described configuration is mounted and fixed to the rear side surface 800*d* of the housing 2 using the above described screw N1, as shown in FIG. 30. At the time of the mounting, as shown in FIG. 31B, connection is made to the label producing apparatus 1 using the above described serial connection jack 801*b*. That is, the first power supply connection jack 801*a*, the serial connection jack 801*b*, the second USB connection jack 801*c*, the LAN cable connection jack 801*d*, and the first USB connection jack 801*e* are arranged from the above described right side to the above described left side, in that order, on the interface part IF, as previously described (refer to FIG. 31A). That is, the first USB connection jack 801*e* is disposed on the farthest left-side end part in the horizontal direction.

At this time, a USB connection plug (not shown) can be inserted from a host device into the second USB connection jack 801*c*, with the longitudinal direction oriented in the substantially horizontal direction. A LAN connection plug (not shown) can be inserted into the LAN cable connection jack 801*d*, with the gripping hook part oriented toward the upper side. A USB connection plug PL can be inserted into the first USB connection jack 801*e*, with the longitudinal direction oriented in the substantially vertical direction (from a so-called function device; refer to FIG. 32B described later).

Then, when the above described wireless communication unit 1000 is mounted to the housing 2, the serial connection jack 801*b* is used, as shown in the above described FIG. 31B and the above described FIG. 30. That is, the wireless communication unit 1000 is installed to the upper side of the recessed part 801 located on the interface part IF of the rear side surface 800*d*, without covering the interface part IF. At that time, the above described serial connection plug SPL of the above described unit coupling device 1001 is inserted into the serial connection jack 801*b*, with the gripping hook part oriented on the lower side. At this time, the unit coupling device 1001 connects the wireless communication unit 1000 and the corresponding serial connection jack 801*b* (while exposing the other above described connection jacks). With this connection, the label producing apparatus 1 can perform information transmission and reception by wireless communication with external devices via the wireless communication unit 1000.

Mounting Other Wireless Communication Units

Further, according to this embodiment, another wireless communication unit 1000' that differs from the wireless communication unit 1000 that performs the above described Bluetooth (registered trademark) communication can also be mounted (refer to FIG. 33, etc., described later). In this example, the wireless communication unit 1000' performs wireless communication with external devices and executes information transmission and reception of the above described print data, etc., for example, by performing mutually recognized wireless communication that differs from the mutually recognized wireless communication of the above described wireless communication unit 1000, such as Wi-Fi (registered trademark), for example.

Figure 32A:
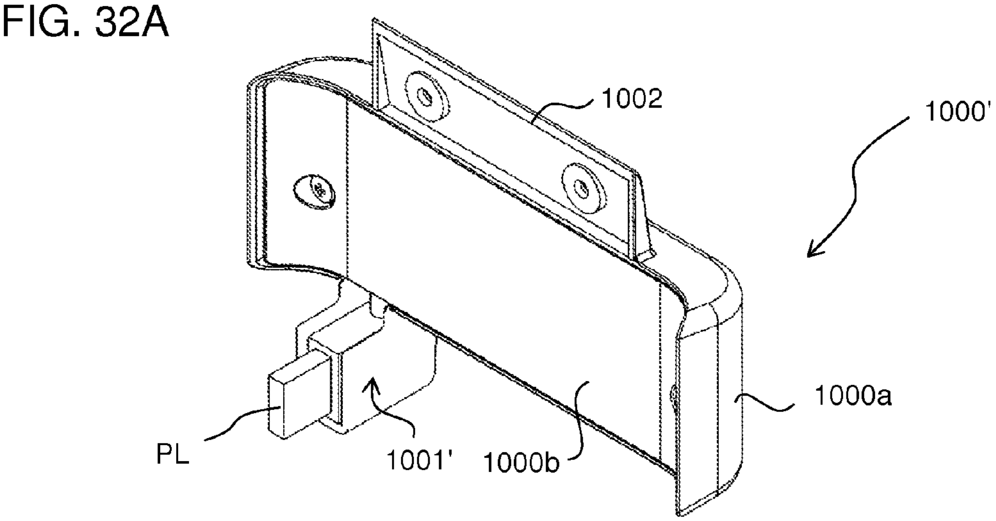
FIG. 32A is a perspective view showing the wireless communication unit comprising a USB connection plug.

FIG. 32A shows the configuration of the wireless communication unit 1000'. Parts equivalent to the above described wireless communication unit 1000 are given the same reference numerals, and the descriptions are omitted or simplified. The wireless communication unit 1000', similar to the above described wireless communication unit 1000, comprises the back side surface 1000*b*, the face side surface 1000*a*, the installation base part 1002, the power supply indicator 1004, and the conduction switch 1005.

Then, a unit coupling device 1001' integrally extends to a location corresponding to the position of the above described first USB connection jack 801*e* of the above described interface part IF of the housing 2, on the lower edge side of the wireless communication unit 1000'.

The unit coupling device 1001' comprises a USB connection plug PL with the longitudinal direction oriented in the substantially vertical direction so as to be inserted into the above described first USB connection jack 801*e*, and a USB cable (not shown) that connects the USB connection plug PL and the above described wireless communication unit 1000'.

Figure 32B:
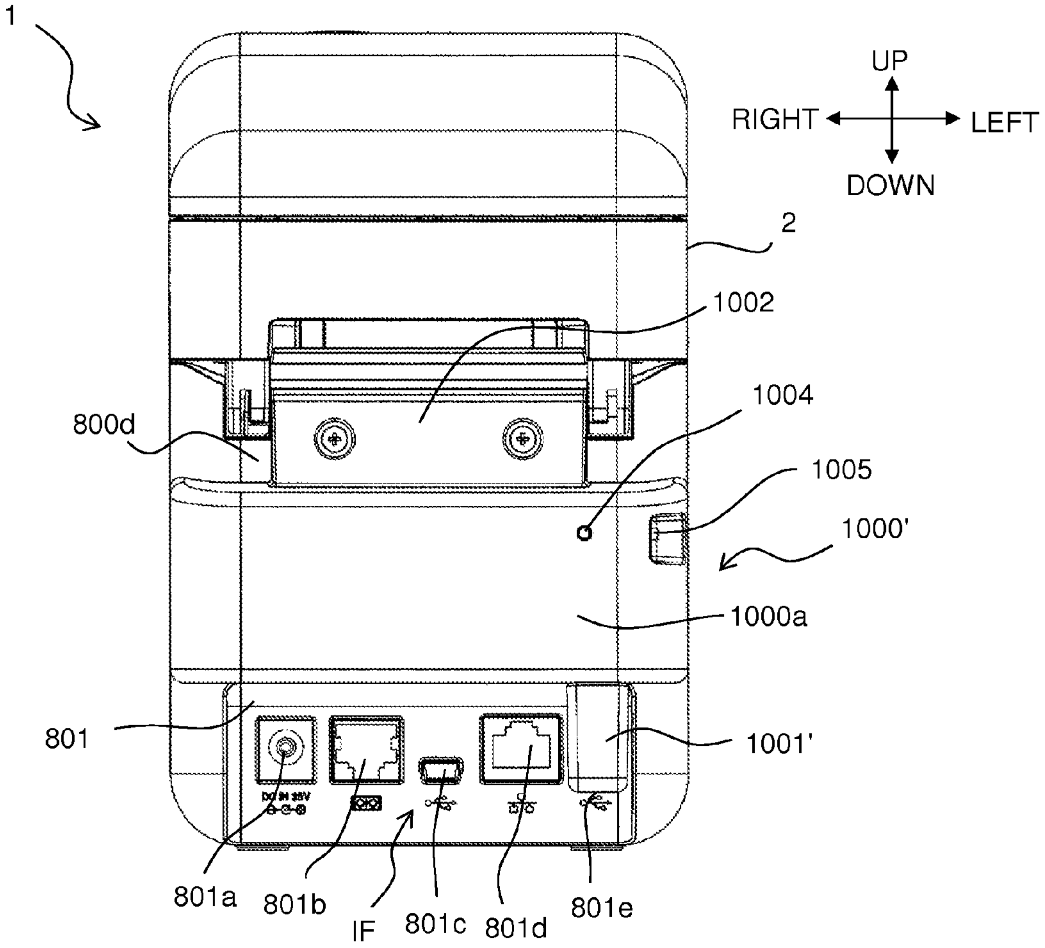
FIG. 32B is a rear view of the label producing apparatus with the wireless communication unit of FIG. 32A mounted to the back surface part.
Figure 33:
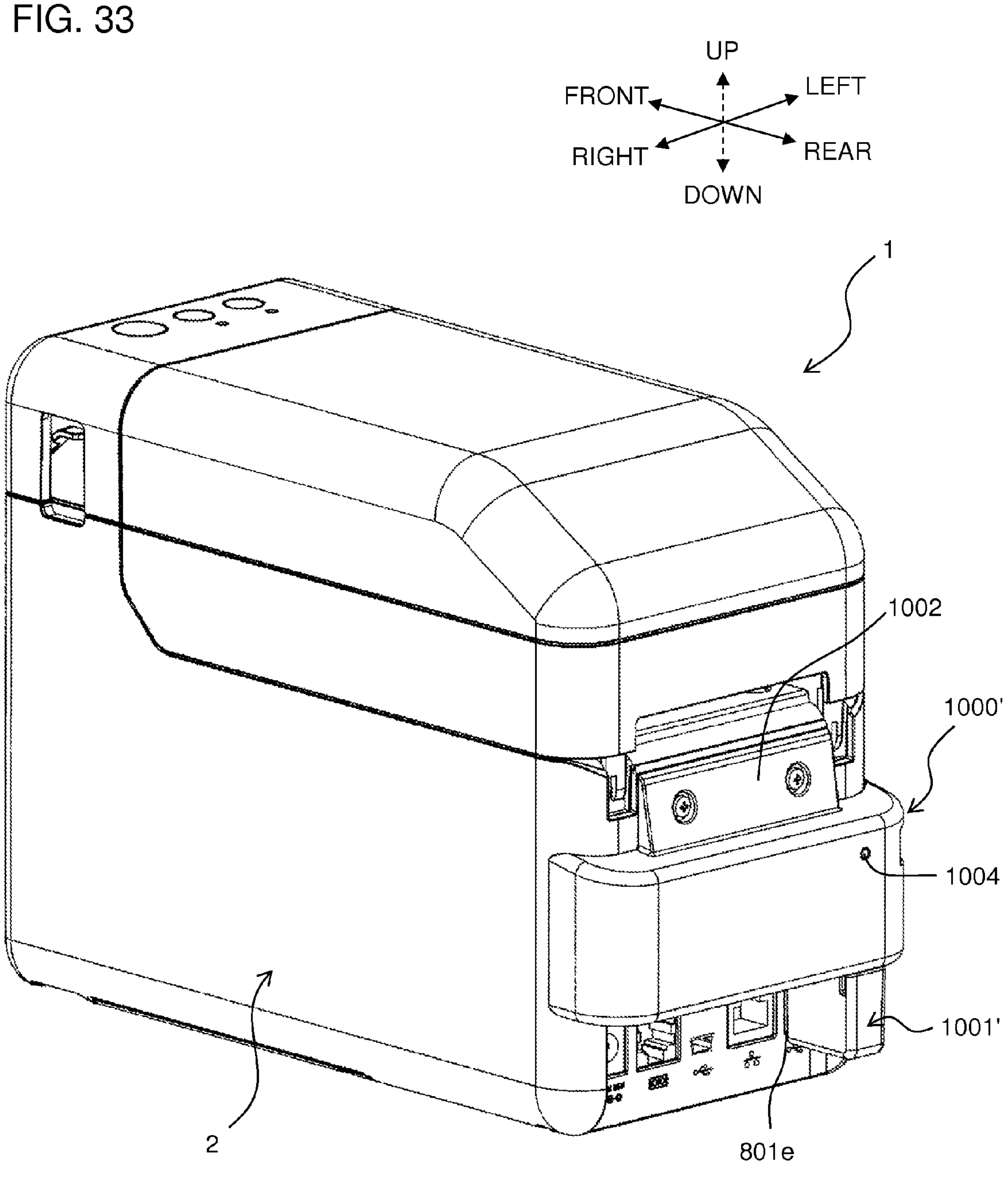
FIG. 33 is a perspective view of the label producing apparatus with the wireless communication unit mounted to the back surface part.

Then, as shown in FIG. 32B and FIG. 33, when the above described wireless communication unit 1000' is mounted to the housing 2, the wireless communication unit 1000' is installed to the upper side of the recessed part 801 located on the interface part IF of the rear side surface 800*d*, with the interface part IF not covered, similar to the above described wireless communication unit 1000. At that time, the above described USB connection plug PL of the above described unit coupling device 1001' is inserted into the first USB connection jack 801*e*, with the longitudinal direction oriented in the substantially vertical direction. At this time, the unit coupling device 1001' connects the wireless communication unit 1000' and the corresponding first USB connection jack 801*e* (while exposing the other above described connection jacks), similar to the above described unit coupling device 1001. With this connection, the label producing apparatus 1 can perform information transmission and reception by wireless communication with external devices via the wireless communication unit 1000'.

As described above, in this embodiment, the rib member 300 contacts the print-receiving tape 3A fed through the section between the above described sandwiching position O and the support position Q from above, making the feeding path of the print-receiving tape 3A substantially linear. With this arrangement, it is possible to most favorably and effectively perform the above described peeling. At this time, the rib member 300 is used, making it possible to decrease the contact surface area when contacting the print-receiving tape 3A from above as described above. As a result, compared to a case where the above described contact from above is performed by a fixed member with a face surface with a flat plate shape or using a pressure roller, it is possible to reliably prevent the occurrence of feeding faults as well as an increase in feeding resistance.

Further, in particular, according to this embodiment, the lower end position of the rib member 300 is positioned above the line directly connecting the above described sandwiching position O and the above described support position Q by the amount Δh. With this arrangement, as previously described, when the actual feeding path of the print-receiving tape 3A becomes linear and in a stretched state from the above described sandwiching position O to the above described support position Q, the rib member 300 does not contact the print-receiving tape 3A. As a result, it is possible to reliably prevent an increase in useless feeding resistance.

Further, in particular, according to this embodiment, the separation plate 200 is disposed so that the height-direction position of the above described support position Q is further below the height-direction position of the above described sandwiching position O. This design has significance such as follows.

That is, as previously described, in a case where the print head 61 contacts the upper part of the platen roller 66 and the pinch roller 201 contacts the lower part of the platen roller 66 to feed the print-receiving tape, the need to dispose the pinch roller 201 on the relatively frontward side arises if it is assumed that the height-direction position of the above described sandwiching position O and the height-direction position of the above described support position Q are made the same (that is, if it is assumed that the feeding path from the sandwiching position O to the support position Q is made substantially horizontal). As a result, restrictions arise in the layout inside the housing 2, inviting an increase in size in the front-rear direction of the housing 2.

Further, as previously described, the opening/closing lid 6C comprising the above described second discharging exit 6B of the front panel 6 of the housing 2 is pivotable toward the frontward side, and the pinch roller 201 is provided to this opening/closing lid 6C. In the case of this configuration, a structure wherein the pinch roller 201 slips into and locks below the above described platen roller 66 by one touch with the operation that closes the opening/closing lid 6C, thus positioning the pinch roller 201 in a predetermined contact position with the above described platen roller 66, is preferred from the viewpoint of operability. Nevertheless, assuming that the pinch roller 201 is disposed relatively frontward as described above, the above described slipping and locking structure becomes difficult.

Hence, according to this embodiment, as previously described, the height-direction position of the above described support position Q of the above described separation plate 200 is made lower than the height-direction position of the above described sandwiching position O by the print head 61 and the platen roller 66. With this arrangement, the position of the pinch roller 201 can be disposed relatively rearward, making it possible to avoid the above described harmful effect and achieve favorable operability.

Further, in particular, according to this embodiment, as described above, the rib member 300 is integrally provided with the print head 61 as the head unit HU, and the head unit HU comprising the print head 61 is provided so that it can move close to and away from the platen roller 66. With the rib member 300 thus integrally configured with the print head 61, the number of parts as well as the installation space can be decreased compared to a case where the two are separately provided. Further, at this time, since the print head 61 moves close to and away from the platen roller 66, the rib member 300 does not have a fixed positional relationship with the feeding path, making it possible for the rib member 300 to flexibly move close to and away from the feeding path in accordance with the feeding state. As a result of this as well, it is possible to reliably prevent an increase in useless feeding resistance.

Further, in particular, according to this embodiment, the rib member 300 does not have a fixed positional relationship with the feeding path, making it possible for the rib member 300 to oscillate in accordance with the feeding state using the above described sandwiching position O as a fulcrum point and flexibly move close to and away from the feeding path. As a result of this as well, it is possible to reliably prevent an increase in useless feeding resistance.

Further, according to this embodiment, the guide members 20A and 20B contact an end surface in the width direction of the roll 3 of the roll storage part 4, and guide the print-receiving tape 3A fed out from the roll 3 in the width direction. The guide members 20A and 20B are capable of advancing and retreating along the above described left-right direction. With this arrangement, the guide members 20A and 20B are suitably made to advance and retreat and adjust position in accordance with the width of the stored roll 3, thereby making it possible for the guide members 20A and 20B to contact the end surface of the rolls 3 with various widths. Accordingly, it is possible to reliably guide the print-receiving tape 3A while supporting the roll 3 with any width. At that time, the through-holes 400A and 400B are provided to the guide members 20A and 20B configured to be capable of advancing and retreating in the left-right direction as described above. The above described support rollers 52 and 53 are respectively inserted in the above described left-right direction into the through-holes 400A and 400B, and thus the guiding when the above described guide members 20A and 20B advance and retreat in the width direction is performed. As a result, it is possible to easily and smoothly adjust the position of the guide members 20A and 20B in order to support the roll 3 with any width as previously described.

Further, in particular, according to this embodiment, the first guide member 20A contacts the roll 3 from the right side and the second guide member 20B contacts the roll 3 from the left side. With this arrangement, it is possible to reliably guide the print-receiving tape 3A while sandwiching the roll 3 from both width-direction sides. Further, with the meshing of the rack members 406 and 407 and the gear 408, it is possible to make both the first guide member 20A and the second guide member 20B movable and link the advancing and retreating movement of the guide members 20A and 20B. With this arrangement, it is possible to easily arrange the width-direction center position of each of the rolls 3, even when the rolls 3 with various widths are used.

Further, in particular, according to this embodiment, in addition to the guiding of the left-right direction advancing and retreating of the guide members 20A and 20B by the above described support rollers 52 and 53, the width-direction advancing and retreating of the guide members 20A and 20B are guided by the fitting of the guide support part 24 provided to the guide members 20A and 20B together with the rail member 11 provided to the bottom surface of the roll storage part 4 as well. Further, at that time, the width-direction advancing and retreating of the guide members 20A and 20B are guided by the support rollers 52 and 53 inserted through each of the through-holes 400A and 400B on both sides of the above described guide support part 24. With this arrangement, it is possible to adjust the position of the guide members 20A and 20B more easily and smoothly.

Further, in particular, according to this embodiment, the engaging and sliding parts 401 and 402 of the guide members 20A and 20B engage and slide with the engaged parts 403 and 404 of the roll storage part 4. With this arrangement, it is possible to more reliably achieve smooth width-direction advancing and retreating by the guide members 20A and 20B.

Further, in particular, according to this embodiment, the guide protruding part 405 is provided in a protruding manner along the above described left-right direction to the upper part of the frontward side of the guide members 20A and 20B. With this arrangement, the flopping of the print-receiving tape 3A in the up-down direction is suppressed at both end parts of the print-receiving tape 3A fed out from the roll 3 as previously described, making it possible to reliably perform smooth feeding.

Further, in this embodiment, the sensor unit 100 is structured so that the sensor main body 101 mounted to the upper part of the mounting surface 103 moves in the above described left-right direction along the through-hole 104 while the engaging foot part 107 provided to the lower part engages with the lower part of the mounting surface 103. With this arrangement, compared to a prior art structure where a shaft member is passed through the interior of the sensor unit 100 in the left-right direction and the sensor unit 100 slides and moves along the shaft, it is possible to achieve movement of the sensor unit 100 in the left-right direction with a simple structure. Further, by providing the insertion hole part 106*a*, which is a large hole section in a partial area of the through-hole 104, it is possible to first assemble the sensor disposing part 102 and the surrounding structure thereof and then insert and install the sensor unit 100 from the insertion hole part 106*a*, as previously described. With this arrangement, compared to the above described prior art structure which requires installation of a large assembly with the shaft member passed through the interior of the sensor unit 100 in the width direction, it is possible to simplify and rationalize the manufacturing process.

On the other hand, according to this embodiment, the spring member 600 is configured to mesh with the rack member 105 from the substantially horizontal direction. This design has significance such as follows. That is, as previously described, the user (grips the sensor unit 100 by hand, for example, and) moves the sensor unit 100 in the width direction while suitably changing the meshing position with the rack member 105 and stops moving the sensor unit 100 at the suitable meshing position, thereby making it possible to easily position the sensor unit 100. As a result, the downward pressing force by the gripping at the time of the above described gripping by the user may act on the sensor unit 100. Thus, assuming that the sensor unit 100 is meshed with the rack member 105 in the up-down direction and the spring member 600 is provided so that the energizing force for the above described meshing acts in the up-down direction (for example, in a case where the spring member 600 is provided to the upper part of the mounting surface 103 at the lower part of the sensor main body 101 or at the upper part of the engaging foot part 107 at the lower part of the mounting surface 103, etc.), the above described pressing force acts on the spring member 600, possibly damaging the spring member 600 or adversely affecting durability.

In particular, according to this embodiment, the configuration is designed so that the rack member 105 is provided to the rearward side of the above described through-hole 104, and the meshing with the rack member 105 occurs from the substantially horizontal direction, in correspondence with the above. Then, the spring member 600 imparts an elastic energizing force for the meshing on the lower part of the sensor main body 101 from the substantially horizontal direction. With this arrangement, even in a case where a pressing force acts downward as described above, it is possible to prevent the spring member 600 from getting damaged as well as a decrease in durability.

Further, in particular, according to this embodiment, the spring member 600 comprises the base end part 601, the middle part 603, and the tip end part 602, and the tip end part 602 meshes with the rack member 105 from the substantially horizontal direction. With the spring member 600 itself thus meshing with the rack member 105, it is possible to decrease the number of parts as well as reduce the overall size of the sensor unit 100 compared to a case where a dedicated member for meshing with the spring member 600 is separately provided.

Further, in particular, according to this embodiment, the middle part 603 between the base end part 601 and the tip end part 602 comprises the horizontal extending part 604→the hanging extending part 605→the width extending part 606, from the base end part 601 side toward the tip end part 602 side. With a long path thus existing between the base end part 601 and the tip end part 602, it is possible to impart a flexible and adequate elastic energizing force to the tip end part 602.

Further, in particular, according to this embodiment, the spring member 600 is configured to be substantially L-shaped in the planar view. With this arrangement, it is possible to prevent an increase in the overall size of the sensor unit 100 in the planar view while establishing a configuration that provides a long path between the base end part 601 and the tip end part 602 as described above and imparts a flexible and adequate elastic energizing force.

Further, in particular, according to this embodiment, as previously described, after the sensor disposing part 102 is first assembled during the manufacturing process, it is possible to install the sensor unit 100 to the sensor disposing part 102 by inserting the engaging foot part 107 from the insertion hole parts 106*a* and 106*b* of the through-hole 104, moving it to the slide hole part 104*a*, and then engaging it with the mounting surface. Further, with the aforementioned cover member 501 assembled after this installation, the prohibiting member 500 integrally provided to the cover member 501 prevents the engaging foot part 107 moved to the above described slide hole part 104*a* from mistakenly once again becoming disengaged from the insertion hole parts 106*a* and 106*b* and released. As a result, compared to the aforementioned prior art structure, it is possible to further reliably simplify and rationalize the manufacturing process.

Further, in this embodiment, as previously described, the above described locking hook 704 is provided to areas of the sheet cover 700 other than the center part that is most likely naturally gripped by the operator during the above described carrying. With this arrangement, it is possible to prevent the sheet cover 700 from mistakenly coming off the housing 2 (or the touch panel 5A) during the carrying by the operator while making it possible to remove the sheet cover 700 from the touch panel 5A when the operation sheet S is replaced.

Further, in particular, according to this embodiment, the locking hook 704 comprises the based end part 704*a*, the curved part 704*b*, and the tip end part 704*c*. Then, with the displacement of the tip end part 704*c* toward the apparatus inner side by the flexure of this substantially vertical part 707, the locking to the locked part 705 is released. With this arrangement, at the time that the sheet cover 700 is removed, it is possible to easily disengage and remove the locking hook 704 from the locked part 705 by deflecting and displacing the tip end part 704*c* toward the apparatus inside so that the left and right substantially vertical parts 707 of the sheet cover 700 with a cross-section that is substantially cuboid-like and open to the left come close to each other.

Further, in particular, according to this embodiment, the indicator 708 that indicates the existence of the locked part 705 is provided to the sheet cover 700. With this arrangement, it is possible for the operator to reliably visually recognize the positions of the locked part 705 and the locking hook 704. As a result, it is possible to more reliably prevent the operator from mistakenly removing the sheet cover 700 during carrying.

Further, in this embodiment, the shielding member 804 is provided to the battery power supply unit 802 mountable to the bottom part of the housing 2. The shielding member 804 at least partially shields the receiving side of the external power supply connection plug 900*a* of the first power supply connection jack 801*a* provided to the above described housing 2 when the battery power supply unit 802 is mounted to the housing 2. With this arrangement, when the operator attempts to connect the external power supply connection plug 900*a* of the external power supply apparatus 900, the first power supply connection jack 801*a* becomes blocked and not visible (or difficult to see; refer to FIG. 25B) from the operator side. As a result, the above described misconnection can be prevented. Note that, when the battery power supply unit 802 is disengaged from the bottom part of the housing 2, the shielding of the shielding member 804 is suspended, making it possible for the operator to reliably connect the above described external power supply connection plug 900*a* to the first power supply connection jack 801*a*, as shown in FIG. 25A.

Further, in particular, according to this embodiment, when the battery power supply unit 802 is mounted to the housing 2, the shielding member 804 partially exposes the receiving side of the power supply terminal of the above described first power supply connection jack 801*a*, without completely shielding it (refer to FIG. 25B). With this arrangement, due to the existence of the shielding member 804, it is possible to ensure that connection to another connection terminal (the serial connection jack 801*b*, the second USB connection jack 801*c*, the LAN cable connection jack 801*d*, and the first USB connection jack 801*e* in the aforementioned example) provided to the above described interface part IF is not obstructed.

Further, in particular, according to this embodiment, even when the battery power supply unit 802 is mounted to the bottom part of the housing 2, unevenness does not occur on the outer shape of the overall apparatus shaped by the front side surface 800*a*, the right side surface 800*b*, the left side surface 800*c*, and the rear side surface 800*d* of the housing 2, and the front side surface 802*a*, the right side surface 802*b*, the left side surface 802*c*, and the rear side surface 802*d* of the battery power supply unit 804. Thus, the aesthetic appeal of the overall apparatus can be improved.

Further, in particular, according to this embodiment, even when the battery power supply unit 802 is mounted to the bottom part of the housing 2 and the shielding member 804 is inserted into the recessed part 801, the above described face surface part 804*b* of the shielding member 804 is on substantially the same plane as the rear side surface 800*d* of the housing 2. That is, the shielding member 804 does not jut out into a convex shape from the rear side surface 800*d* of the housing 2, and thus no unevenness occurs in the outer shape. With this arrangement, the aesthetic appeal of the overall apparatus can be further improved.

Further, in this embodiment, the wireless communication unit 1000 (or the wireless communication unit 1000') is installed so that the interface part IF is not covered on the upper side of the recessed part 801 located on the interface part IF. At that time, the unit coupling device 1001 connects the wireless communication unit 1000 (or the wireless communication unit 1000') and the corresponding serial connection jack 801*b* (or the first USB connection jack 801*e*) while exposing the other above described connection jacks. With this arrangement, the label producing apparatus 1 performs information transmission and reception by wireless communication with external devices via the wireless communication unit 1000 (or the wireless communication unit 1000').

With this arrangement, even if the wireless communication unit 1000 (or the wireless communication unit 1000') is mounted and the unit coupling device 1001 of the wireless communication unit 1000 (or the wireless communication unit 1000') is connected to one of the connection jacks of the interface part IF, the other connection jacks of the interface part IF can be used for other connection applications. As a result, even in a case where the label producing apparatus 1 performs information transmission and reception with external devices by wireless communication, it is possible to further connect the label producing apparatus 1 with other external devices (such as an operation terminal or other label producing apparatus, for example) by a wired connection. Accordingly, it is possible to expand the connection forms at the time of use in a diverse manner and improve convenience.

Further, in particular, according to this embodiment, when the wireless communication unit 1000 is mounted to the housing 2, the above described serial connection plug SPL of the above described unit coupling device 1001 is inserted into the serial connection jack 801*b*, with the gripping hook part oriented on the lower side. In this state, the wireless communication unit 1000, the serial cable, the serial connection plug SPL, and the serial connection jack 801*b* are arranged in a row in that order, from above to below, on the lower part of the rear side surface 800*d* of the housing 2 (refer to FIG. 30). At that time, the gripping hook part of the serial connection plug SPL is positioned not on the wireless communication unit 1000 or the serial cable side, but on the opposite side (the lower side where there is no such interfering object). As a result, the serial connection plug SPL can be inserted into and removed from the serial connection jack 801*b* relatively easily, making it possible to improve workability at the time of attachment and detachment of the wireless communication unit 1000.

Further, in particular, according to this embodiment, the power supply indicator 1004 that indicates the power ON state is provided to the face side surface 1000*a*. With this arrangement, when the wireless communication unit 1000 is mounted to a predetermined area of the housing, the operator can clearly recognize that the wireless communication unit 1000 is properly electrically connected and that the power supply is ON. As a result, operator convenience is improved.

Further, in particular, according to this embodiment, the wireless communication unit 1000 capable of executing Bluetooth (registered trademark) communication and the wireless communication unit 1000' capable of executing Wi-Fi communication can be selectively mounted to the housing 2 and connected on the interface part IF. As a result, the suitable single wireless communication unit 1000 or 1000' that corresponds to the type of wireless communication to be preferably executed can be selected from the wireless communication unit 1000 and the wireless communication unit 1000', making it possible to use the apparatus for different purposes. As a result, compared to a case where all of the plurality of types of mutually recognized wireless communication functions are incorporated in the label producing apparatus 1 in a fixed manner, it is possible to reduce the overall size of the apparatus.

Further, in particular, according to this embodiment, the USB connection plug PL provided to the unit coupling device 1001' of the wireless communication unit 1000' attached to and detached from the housing 2 is connected to the first USB connection jack 801*e* of the interface part IF. At this time, the above described USB connection plug PL is inserted into and removed from the first USB connection jack 801*e* with the longitudinal direction oriented in the substantially vertical direction (in a so-called vertical orientation). With this arrangement, it is possible to prevent an increase in size in the substantially horizontal direction dimension of the interface part IF and reduce the size. Further, of all of the connection jacks 801*a*-801*e*, the first USB connection jack 801*e* is disposed on the farthest left side end part of the above described interface part IF. With this arrangement, it is possible to make the surface of one width-direction side of the USB connection plug PL of the above described wireless communication unit 1000' face the apparatus outside (the left side in this example; refer to FIG. 33 and FIG. 32B) where there are no other connection jacks 801*a-d* or interfering objects, etc. As a result, the USB connection plug PL can be inserted into and removed from the first USB connection jack 801*e* relatively easily, making it possible to improve workability at the time of attachment and detachment of the wireless communication unit 1000'.

Note that the present disclosure is not limited to the above described embodiment, and various modifications may be made without deviating from the spirit and scope of the disclosure.

For example, while the above has been described in connection with an illustrative scenario in which the print-receiving tape 3A having the label mounts L consecutively disposed on the tape is used, the present disclosure is not limited thereto, allowing the present disclosure to be applied to configurations in which the print label may also be produced by performing printing on a print-receiving tape on which a print-receiving tape layer (thermal layer or image-receiving layer) is formed across the entire tape face surface and cutting the tape to a predetermined length. Further, while the above has described a method in which printing is performed on the print-receiving tape 3A (a so-called non-laminated method), the present disclosure may also be applied to a method where printing is performed on a cover film different from the print-receiving tape 3A and then the two are bonded (a so-called laminated method).

Further, while the above has been described in connection with an illustrative scenario in which the print-receiving tape 3A is fed out from the upper side of the roll 3, the present disclosure is not limited thereto, allowing application to a case where the print-receiving tape 3A is fed out from the lower side of the roll 3. In such a case, a force acts on the roll 3, attempting to roll the roll 3 in the direction opposite the tape feed-out direction (toward the rearward side in this example), making it best to dispose the third roller 53 on the side opposite the feed-out direction side of the print-receiving tape 3A in contrast to the first and second rollers 51 and 52.

Further, the arrow shown in FIG. 28 denotes an example of signal flow, but the signal flow direction is not limited thereto.

Further, other than that already stated above, techniques based on the above described embodiments and each of the modifications may be suitably utilized in combination as well.

What is claimed is:

1. A printer comprising:

a feeder configured to feed a print-receiving medium;

a printing head configured to perform desired printing on said print-receiving medium fed by said feeder;

a substantially cuboid-like shaped housing comprising a longitudinal direction and a width direction, containing said feeder and said printing head;

a touch panel portion provided to an upper part of said housing; and a cover configured to cover a portion of said touch panel portion, said cover comprising a plurality of locking hooks provided to areas other than a center part of said cover along said longitudinal direction, said touch panel portion comprising a plurality of locked parts to which said plurality of locking hooks are respectively to be locked, said touch panel portion and said cover are included in an upper cover unit, said upper cover unit is pivotably connected to said housing at one end in the longitudinal direction, said upper cover unit further comprises a liquid crystal panel part configured to display a desired display, said upper cover unit including said touch panel portion and said liquid crystal panel part pivots in an integrated manner, said liquid crystal panel part is pivotably connected to said touch panel portion at the one end in the longitudinal direction, said touch panel portion comprises an operation surface facing upward and being capable of executing desired operation input;

said cover comprises an inner peripheral surface configured to sandwich an operation sheet with said operation surface, said cover comprises:

a substantially horizontal part positioned on an upper part of said operation sheet; and a left and right pair substantially vertical parts provided so as to cover each lateral side of said touch panel portion while hanging substantially vertically downward from each of both end parts of said substantially horizontal part along said width direction;

said plurality of locking hooks is provided to the areas of said inner peripheral surface of each of said left and right pair of substantially vertical parts respectively on one side and the other side in said width direction.

2. The printer according to claim 1, wherein:

each of said plurality of locking hooks comprises:

a base end part consecutively connected to said inner peripheral surface of said substantially vertical part;

a curved part provided further on a tip end side than said base end part; and a tip end part provided further on said tip end side than said curved part and configured to face the apparatus outward side along said width direction, and said tip end part is displaced toward an apparatus inward side by a flexure of said substantially vertical part, thereby releasing a locking of the locking hook to said locked part.

3. The printer according to claim 1, wherein:

said cover comprises an indicator configured to indicate an existence of said locked part in an outer peripheral area corresponding to said locked part.

4. The printer according to claim 1, wherein:

said touch panel portion comprises a left side surface part and a right side surface part respectively covered by said left and right substantially vertical parts when said cover is mounted; and each side surface part comprises:

a contact part contacted by an inner peripheral surface of said substantially vertical part corresponding thereto when said cover is mounted; and a recessed part provided near said locked part, receded further in said width direction than said contact part.

5. The printer according to claim 4, wherein:

said recessed part of said side surface part comprises an oblique rib provided so as to protrude obliquely toward an outward side along said width direction, from above to below.

6. The printer according to claim 1, wherein:

said locked part comprises:

a first locked part positioned on one side in said longitudinal direction; and a second locked part positioned on the other side in said longitudinal direction, and a dimension of said liquid crystal panel part in a direction substantially along said longitudinal direction with said liquid crystal panel part lowered so as to cover said touch panel portion is set so that said liquid crystal panel part reaches an area above said first locked part but not an area above said second locked part.

7. The printer according to claim 1, where:

said plurality of locking hooks is not provided to said center part of said cover along said longitudinal direction, said plurality of locked parts is provided to areas other than a center part of said touch panel portion along said longitudinal direction.

8. The printer according to claim 7, wherein:

said plurality of locking hooks is provided respectively on one side and other side of said cover in said longitudinal direction, the both sides sandwiching an area that said locking hooks are not provided.

9. The printer according to claim 8, wherein:

two of said locking hooks are respectively provided on both sides of the one side and the other side of said cover in said longitudinal direction.

10. The printer according to claim 1, wherein:

a housing cover part constituting a part of said housing is integrally configured with said upper cover unit, said housing cover part pivot in an integrated manner with said upper cover unit.

* * * * *